(12) United States Patent
Koshida

(10) Patent No.: US 10,241,503 B2
(45) Date of Patent: Mar. 26, 2019

(54) BOARD PROCESSING APPARATUS, BOARD PROCESSING METHOD, AND BOARD PROCESSING SYSTEM

(71) Applicant: SCREEN Holdings Co., Ltd., Kyoto (JP)

(72) Inventor: Takashi Koshida, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 287 days.

(21) Appl. No.: 14/907,617

(22) PCT Filed: Jul. 10, 2014

(86) PCT No.: PCT/JP2014/068467
§ 371 (c)(1),
(2) Date: Jan. 26, 2016

(87) PCT Pub. No.: WO2015/016033
PCT Pub. Date: Feb. 5, 2015

(65) Prior Publication Data
US 2016/0161941 A1 Jun. 9, 2016

(30) Foreign Application Priority Data
Jul. 29, 2013 (JP) .................................. 2013-156946

(51) Int. Cl.
G05B 19/418 (2006.01)
G05B 19/402 (2006.01)
H01L 21/67 (2006.01)

(52) U.S. Cl.
CPC ....... G05B 19/4189 (2013.01); G05B 19/402 (2013.01); G05B 19/41815 (2013.01);
(Continued)

(58) Field of Classification Search
CPC .............. G05B 19/4189; G05B 19/402; G05B 19/41815; G05B 2219/45031;
(Continued)

(56) References Cited

U.S. PATENT DOCUMENTS 6,282,457 B1  8/2001  Miura et al. ................... 700/121
8,140,181 B2  3/2012  Ogi ............................... 700/214
(Continued)

FOREIGN PATENT DOCUMENTS

JP  10-321575   12/1998
JP  2005-093653  4/2005
(Continued)

OTHER PUBLICATIONS

Notification Concerning Transmittal of International Preliminary Report on Patentability (Chapter I) with a Notification from International Bureau (Form PCT/IB/326) dated Feb. 11, 2016.
(Continued)

Primary Examiner — Charles R Kasenge
(74) Attorney, Agent, or Firm — Ostrolenk Faber LLP

(57) ABSTRACT

A second control device of a second substrate processing apparatus creates a virtual carrier, thereby storing a piece of positional information of a substrate to be carried into the second substrate processing apparatus through a direct carry-in entrance before the substrate is carried into the second substrate processing apparatus. The second control device creates a second schedule to convey a substrate carried into the second substrate processing apparatus through the direct carry-in entrance from the outside of the second substrate processing apparatus to the inside of the second substrate processing apparatus, based on the pre-stored positional information of the substrate outside the second substrate processing apparatus, before the substrate is carried into the second substrate processing apparatus.

18 Claims, 9 Drawing Sheets

(52) U.S. Cl.
CPC .............. *G05B 2219/40066* (2013.01); *G05B 2219/45031* (2013.01); *G05B 2219/45054* (2013.01); *H01L 21/67276* (2013.01); *Y02P 90/08* (2015.11); *Y02P 90/20* (2015.11); *Y02P 90/28* (2015.11); *Y02P 90/86* (2015.11)

(58) Field of Classification Search
CPC ........... G05B 2219/45054; G05B 2219/40066; Y02P 90/86; Y02P 90/28; Y02P 90/20; Y02P 90/08; H01L 21/67276
See application file for complete search history.

(56) References Cited

U.S. PATENT DOCUMENTS

| | | | | |
|---|---|---|---|---|
| 8,569,650 | B2* | 10/2013 | Zhang | B23K 26/03 219/121.67 |
| 8,634,633 | B2* | 1/2014 | Kiley | H01L 21/681 382/141 |
| 2002/0070983 | A1* | 6/2002 | Kozub | H01L 21/67276 715/846 |
| 2008/0101912 | A1* | 5/2008 | Martin | H01L 21/6719 700/254 |
| 2008/0192023 | A1 | 8/2008 | Yamamoto | 345/173 |
| 2009/0027657 | A1* | 1/2009 | Serebryanov | H01L 21/67259 356/73 |
| 2010/0055901 | A1* | 3/2010 | Zhang | B23K 26/03 438/669 |
| 2012/0295440 | A1* | 11/2012 | Zhang | B23K 26/03 438/669 |
| 2013/0013103 | A1 | 1/2013 | Shibata | 700/228 |
| 2013/0073069 | A1 | 3/2013 | Yamamoto et al. | 700/100 |
| 2013/0085595 | A1* | 4/2013 | Kiley | H01L 21/681 700/121 |
| 2014/0023776 | A1* | 1/2014 | Kuwahara | H01L 21/67259 427/8 |

FOREIGN PATENT DOCUMENTS

| | | |
|---|---|---|
| JP | 2008-198796 A | 8/2008 |
| JP | 2013-016665 | 1/2013 |
| JP | 5185054 B2 | 4/2013 |
| KR | 10-2008-0060669 A | 7/2008 |
| WO | WO97/47032 A1 | 12/1997 |

OTHER PUBLICATIONS

Notification of Transmittal of Translation of the International Preliminary Report on Patentability (Chapter I) with Notification from the International Bureau (Form PCT/IB/338) dated Feb. 11, 2016.
International Search Report dated Oct. 7, 2014 in corresponding PCT International Application No. PCT/JP2014/068467.
Written Opinion dated Oct. 7, 2014 in corresponding PCT International Application No. PCT/JP2014/068467.

* cited by examiner

FIG. 8

| FIRST CARRIER SETTING INFORMATION |
|---|
| FIRST CARRIER IDENTIFICATION INFORMATION |
| FIRST LOAD PORT IDENTIFICATION INFORMATION |
| SUBSTRATE IDENTIFICATION INFORMATION: W1 |
| SUBSTRATE INSERTION STATE OF FIRST SLOT: "PRESENT" |
| SUBSTRATE IDENTIFICATION INFORMATION: W2 |
| SUBSTRATE INSERTION STATE OF SECOND SLOT: "PRESENT" |
| SUBSTRATE IDENTIFICATION INFORMATION: W3 |
| SUBSTRATE INSERTION STATE OF THIRD SLOT: "PRESENT" |
| ⋮ |
| SUBSTRATE IDENTIFICATION INFORMATION: W20 |
| SUBSTRATE INSERTION STATE OF 20TH SLOT: "PRESENT" |
| ⋮ |
| SUBSTRATE IDENTIFICATION INFORMATION: 0 |
| SUBSTRATE INSERTION STATE OF 25TH SLOT: "ABSENT" |

FIG. 9

| TABLE T1 | |
|---|---|
| VIRTUAL CARRIER CREATION COMMAND | CORRELATION |
| FIRST CARRIER IDENTIFICATION INFORMATION | VIRTUAL CARRIER IDENTIFICATION INFORMATION |
| FIRST LOAD PORT IDENTIFICATION INFORMATION | VIRTUAL LOAD PORT IDENTIFICATION INFORMATION |

BOARD PROCESSING APPARATUS, BOARD PROCESSING METHOD, AND BOARD PROCESSING SYSTEM

CROSS-REFERENCE TO RELATED APPLICATIONS

The present application is a 35 U.S.C. §§ 371 national phase conversion of PCT/JP2014/068467, filed Jul. 10, 2014, which claims priority to Japanese Patent Application No. 2013-156946, filed Jul. 29, 2013, the contents of both of which are incorporated herein by reference. The PCT International Application was published in the Japanese language.

FIELD OF THE ART

The present invention relates to a substrate processing apparatus that processes substrates, relates to a substrate processing method, and relates to a substrate processing system. Examples of substrates to be processed include a semiconductor wafer, a substrate for use in liquid crystal display devices, a substrate for use in plasma displays, a substrate for use in FEDs (Field Emission Displays), a substrate for use in optical disks, a substrate for use in magnetic disks, a substrate for use in magnet-optical disks, a substrate for use in photomasks, a ceramic substrate, and a substrate for use in solar batteries.

BACKGROUND ART

In a process of manufacturing a semiconductor device or a liquid crystal display device, many steps that include two or more steps among a cleaning step, a heating step, a film forming step, an etching step, a resist applying step, an exposing step, and a developing step are performed for a substrate, such as a semiconductor wafer or a glass substrate that is used in a liquid crystal display device.

Patent Document 1 discloses a film-formation processing device that performs film formation, a cleaning device that cleans a substrate that has undergone film formation by means of the film-formation processing device, an intermediate receiving/delivering portion that receives and delivers the substrate between the film-formation processing device and the cleaning device, and a cassette transfer device that transfers a substrate-transfer cassette that contains a plurality of substrates to the film-formation processing device.

Patent Document 2 discloses a substrate processing apparatus provided with a computer that creates a schedule to convey and process a plurality of substrates contained in a substrate container conveyed to the substrate processing apparatus in the substrate processing apparatus.

CITATION LIST

Patent Documents

Patent Document 1: Japanese Patent Application Publication No. 10-321575
Patent Document 2: United States Patent Application Publication No. 2013/0073069

SUMMARY OF INVENTION

Technical Problem

As described in Patent Document 1, there is a case in which a period of time from the end of substrate processing in a substrate processing apparatus to the start of substrate processing in another substrate processing apparatus is desired to be shortened in order to raise the quality of a substrate. However, as described in Patent Document 2, the substrate processing apparatus creates and executes a schedule to convey a substrate in this apparatus. Therefore, when a substrate is directly conveyed between three devices (film-formation device, intermediate receiving/delivering portion, and cleaning device) as in Patent Document 1, there is a possibility that a substrate will not be conveyed between the devices smoothly, and the loss of conveying time will occur.

Therefore, an object of the present invention is to provide a substrate processing apparatus capable of smoothly conveying a substrate between a plurality of apparatuses while shortening a period of time, to provide a substrate processing method, and to provide a substrate processing system.

Solution to Problem

A preferred embodiment of the present invention to achieve the object provides a substrate processing apparatus that creates a job in accordance with a job creation command sent from a host computer and that conveys and/or processes a substrate in a predetermined management area based on the job, the substrate processing apparatus being connected to an intermediate apparatus that conveys a substrate processed by a first substrate processing apparatus in a state of directly supporting the substrate outside the first substrate processing apparatus, the first substrate processing apparatus being another substrate processing apparatus that processes a substrate at an earlier stage than the substrate processing apparatus, the substrate processing apparatus including a direct carry-in entrance that accepts a substrate carried in from the intermediate apparatus, a transfer unit that conveys the substrate carried into the substrate processing apparatus through the direct carry-in entrance and that conveys the substrate inside the management area, a plurality of processing units that process the substrate carried in by means of the transfer unit, and a control device that controls the substrate processing apparatus.

The control device executes a first step of, when the fact that a substrate scheduled to be processed by the substrate processing apparatus has been placed at the first substrate processing apparatus is reported from the host computer, storing positional information of the substrate in the first substrate processing apparatus and correlating the positional information of the substrate in the first substrate processing apparatus with virtual substrate positional information capable of being recognized by the control device, and a second step of, when a job creation command for the substrate is given from the host computer, creating a job to convey and/or process the substrate by means of the substrate processing apparatus while using the virtual substrate positional information.

According to this arrangement, the control device of the substrate processing apparatus stores positional information of a substrate scheduled to be processed in the first substrate processing apparatus in correlation with virtual substrate positional information capable of being recognized by the control device. Although positional information of a substrate scheduled to be processed is required to create a job corresponding to a job creation command sent from the host computer, this is beforehand prepared in the form of virtual substrate positional information at a stage before the substrate scheduled to be processed reaches the substrate processing apparatus in the present invention. Therefore, it is possible to execute a job creating operation from a stage before the substrate actually reaches the substrate processing apparatus. This makes it possible to smoothly convey a substrate between a plurality of substrate processing apparatuses.

The control device may further execute a third step of creating a second schedule including a carrying-in step of allowing the transfer unit to convey a substrate carried into the substrate processing apparatus through the direct carry-in entrance from an outside of the substrate processing apparatus to an inside of the substrate processing apparatus before the substrate is carried into the substrate processing apparatus by use of virtual positional information stored in the first step.

According to this arrangement, a substrate processed by the first substrate processing apparatus is carried into the substrate processing apparatus through the intermediate apparatus that conveys a substrate in a state of directly supporting the substrate. Thereafter, the substrate carried into the substrate processing apparatus is conveyed by the transfer unit, and is processed by the processing unit when needed. The control device stores positional information of a substrate that has not yet been carried into the substrate processing apparatus, i.e., positional information of a substrate outside the substrate processing apparatus. Thereafter, the control device creates a second schedule to convey a substrate from the outside of the substrate processing apparatus to the inside of the substrate processing apparatus through the direct carry-in entrance based on pre-stored positional information before the substrate is carried from the intermediate apparatus into the substrate processing apparatus through the direct carry-in entrance. In this way, the second schedule that also includes a step of conveying a substrate outside the substrate processing apparatus is created, and therefore the substrate is smoothly conveyed from the outside of the substrate processing apparatus to the inside of the substrate processing apparatus. As a result, time loss caused until a substrate carried into the first substrate processing apparatus is conveyed into the substrate processing apparatus through the intermediate apparatus is reduced. This makes it possible to shorten a conveyance period of time of a substrate from the first substrate processing apparatus to the substrate processing apparatus.

The control device may further execute a fourth step of setting a substrate processing condition according to an inspection result of an inspection unit that inspects a substrate processed by the first substrate processing apparatus before the substrate is carried into the substrate processing apparatus. The third step may include a step of creating the second schedule including the carrying-in step and a processing step of allowing the plurality of processing units to process a substrate conveyed to the plurality of processing units in the carrying-in step under the substrate processing condition before the substrate is carried into the substrate processing apparatus by use of virtual positional information stored in the first step.

According to this arrangement, the quality of a substrate processed by the first substrate processing apparatus is inspected before this substrate is carried into the substrate processing apparatus. The control device creates the second schedule not only so that the transfer unit conveys a substrate from the direct carry-in entrance to the inside of the substrate processing apparatus but also so that the processing unit processes a substrate under a substrate processing condition according to an inspection result. Therefore, it is possible for the processing unit to perform a processing operation according to the quality of the substrate, and hence is possible to raise the quality of the substrate.

The fourth step may include a step of setting the substrate processing condition in accordance with an inspection result of the inspection unit provided in one of the first substrate processing apparatus and the intermediate apparatus.

According to this arrangement, the inspection unit is provided in one of the first substrate processing apparatus and the intermediate apparatus, and the quality of a substrate processed by the first substrate processing apparatus is inspected in one of the first substrate processing apparatus and the intermediate apparatus. If the inspection unit is provided in an apparatus other than the first substrate processing apparatus and the intermediate apparatus, i.e., if the inspection unit is provided outside a substrate conveyance route, a substrate is required to be conveyed to the outside of the first substrate processing apparatus and the outside of the intermediate apparatus, and an extra conveying time therefor will occur. Therefore, it is possible to shorten a substrate conveyance period of time from the first substrate processing apparatus to the substrate processing apparatus by providing the inspection unit in one of the first substrate processing apparatus and the intermediate apparatus.

The third step may include a step of creating the second schedule so that a substrate carried into the substrate processing apparatus through the direct carry-in entrance is conveyed by the transfer unit from the outside of the substrate processing apparatus to the load port without conveying the substrate to the plurality of processing units.

According to this arrangement, the control device creates the second schedule so that the transfer unit conveys a substrate from the intermediate apparatus to the load port through the direct carry-in entrance. Therefore, the substrate carried into the substrate processing apparatus through the direct carry-in entrance is conveyed to the load port without being processed by the plurality of processing units. For example, if a substrate processed by the first substrate processing apparatus is defective, substrate processing in the second substrate processing apparatus would be useless. Therefore, in such a case, it is possible to raise the operating efficiency of the second substrate processing apparatus by avoiding the processing of the substrate in the second substrate processing apparatus. Additionally, the conveying path becomes shorter than when a substrate is conveyed via the processing unit, and therefore the stay time of the substrate in the second substrate processing apparatus is shortened. Therefore, for example, if a substrate carried from the intermediate apparatus into the substrate processing apparatus is contaminated, it is possible to restrain or prevent the inside of the substrate processing apparatus from being contaminated by foreign substances that adhere to the substrate. This makes it possible to raise the quality of other substrates.

The substrate processing apparatus may further include an evacuation unit that evacuates a substrate. The third step may include a step of creating the second schedule so that a substrate carried into the substrate processing apparatus through the direct carry-in entrance is conveyed by the transfer unit from the outside of the substrate processing apparatus to the evacuation unit and is conveyed from the evacuation unit to the plurality of load ports. Preferably, the evacuation unit is disposed outside a conveying path (conveying path in the substrate processing apparatus) of a substrate conveyed to the plurality of processing units.

According to this arrangement, the control device creates the second schedule so that the transfer unit conveys a substrate from the intermediate apparatus to the evacuation unit through the direct carry-in entrance and then conveys this substrate from the evacuation unit to the plurality of load ports. In other words, a substrate carried into the substrate processing apparatus through the direct carry-in entrance is conveyed from the intermediate apparatus to the plurality of load ports via the evacuation unit that evacuates a substrate, instead of the plurality of processing units. As described above, if a substrate processed by the first substrate processing apparatus is defective, substrate processing in the second substrate processing apparatus will become useless. Therefore, in such a case, it is possible to raise the operating efficiency of the second substrate processing apparatus by avoiding the processing of the substrate in the second substrate processing apparatus. Additionally, a substrate is conveyed via the evacuation unit instead of the processing unit, and therefore it is possible for the control device to create the schedule of a to-be-evacuated substrate in the same way as a substrate processed by the processing unit.

The substrate processing apparatus may further include a plurality of load ports that hold a plurality of carriers, respectively, capable of containing a plurality of substrates. The control device may further execute a fifth step of creating a first schedule including a carrying-in step of allowing the transfer unit to convey a substrate from the plurality of load ports to the plurality of processing units, a processing step of allowing the plurality of processing units to process the substrate conveyed to the plurality of processing units, and a carrying-out step of allowing the transfer unit to convey the substrate processed by the plurality of processing units from the plurality of processing units to the plurality of load ports.

According to this arrangement, the plurality of load ports that hold the plurality of carriers, respectively, are provided in the substrate processing apparatus. The control device creates the first schedule so that a substrate contained in the carrier is conveyed from the load port to the processing unit and so that the substrate processed by the processing unit is conveyed from the processing unit to the load port. In this way, it is possible for the substrate processing apparatus to accept a substrate not only from the direct carry-in entrance but also from the load port, and therefore it is possible to raise the operating efficiency of the substrate processing apparatus.

The control device may further execute a sixth step of stopping execution of one of the first schedule and the second schedule and allowing the substrate processing apparatus to execute a remaining one of the first schedule and the second schedule.

According to this arrangement, the execution of one of the first schedule and the second schedule is temporarily stopped or is discontinued, i.e., the execution of a non-priority schedule that differs from a priority schedule to take precedence is temporarily stopped or is discontinued. The remaining one of the first schedule and the second schedule is executed, i.e., a priority schedule is executed by the substrate processing apparatus. Therefore, it is possible to make the start of processing of a substrate corresponding to the priority schedule earlier. Therefore, with respect to a substrate corresponding to a priority schedule, it is possible to shorten a period of time from the end of substrate processing in a preceding apparatus (the first substrate processing apparatus) to the start of substrate processing in a subsequent apparatus (the second substrate processing apparatus).

Another preferred embodiment of the present invention provides a substrate processing method executed by a substrate processing apparatus, the substrate processing apparatus creating a job in accordance with a job creation command sent from a host computer and executing conveyance and/or processing of a substrate in a predetermined management area based on the job, the substrate processing apparatus being connected to an intermediate apparatus, the intermediate apparatus conveying a substrate processed by a first substrate processing apparatus in a state of directly supporting the substrate outside the first substrate processing apparatus, the first substrate processing apparatus being another substrate processing apparatus that processes a substrate at an earlier stage than the substrate processing apparatus, the substrate processing apparatus including a direct carry-in entrance that accepts a substrate carried in from the intermediate apparatus, a transfer unit that conveys the substrate carried into the substrate processing apparatus through the direct carry-in entrance and that conveys the substrate inside the management area, a plurality of processing units that process the substrate carried in by means of the transfer unit, and a control device that controls the substrate processing apparatus.

The substrate processing method includes a first step of, when the fact that a substrate scheduled to be processed by the substrate processing apparatus has been placed at the first substrate processing apparatus is reported from the host computer, storing positional information of the substrate in the first substrate processing apparatus and correlating the positional information of the substrate in the first substrate processing apparatus with virtual substrate positional information capable of being recognized by the control device, and a second step of, when a job creation command for the substrate is given from the host computer, creating a job to convey and/or process the substrate by means of the substrate processing apparatus while using the virtual substrate positional information. According to this method, it is possible to fulfill the same effects as the aforementioned ones.

The substrate processing method may further include a third step of creating a second schedule including a carrying-in step of allowing the transfer unit to convey a substrate carried into the substrate processing apparatus through the direct carry-in entrance from an outside of the substrate processing apparatus to an inside of the substrate processing apparatus before the substrate is carried into the substrate processing apparatus by use of virtual positional information stored in the first step. According to this method, it is possible to fulfill the same effects as the aforementioned ones.

The substrate processing method may further include a fourth step of setting a substrate processing condition according to an inspection result of an inspection unit that inspects a substrate processed by the first substrate processing apparatus before the substrate is carried into the substrate processing apparatus. The third step may include a step of creating the second schedule including the carrying-in step and a processing step of allowing the plurality of processing units to process a substrate conveyed to the plurality of processing units in the carrying-in step under the substrate processing condition before the substrate is carried into the substrate processing apparatus by use of virtual positional information stored in the first step. According to this method, it is possible to fulfill the same effects as the aforementioned ones.

The fourth step may include a step of setting the substrate processing condition in accordance with an inspection result of the inspection unit provided in one of the first substrate processing apparatus and the intermediate apparatus.

According to this method, it is possible to fulfill the same effects as the aforementioned ones.

The third step may include a step of creating the second schedule so that a substrate carried into the substrate processing apparatus through the direct carry-in entrance is conveyed by the transfer unit from the outside of the substrate processing apparatus to the load port without conveying the substrate to the plurality of processing units. According to this method, it is possible to fulfill the same effects as the aforementioned ones.

The substrate processing apparatus may further include an evacuation unit that evacuates a substrate. The third step may include a step of creating the second schedule so that a substrate carried into the substrate processing apparatus through the direct carry-in entrance is conveyed by the transfer unit from the outside of the substrate processing apparatus to the evacuation unit and is conveyed from the evacuation unit to the plurality of load ports. According to this method, it is possible to fulfill the same effects as the aforementioned ones.

The substrate processing apparatus may further include a plurality of load ports that hold a plurality of carriers, respectively, capable of containing a plurality of substrates. The substrate processing method may further include a fifth step of creating a first schedule including a carrying-in step of allowing the transfer unit to convey a substrate from the plurality of load ports to the plurality of processing units, a processing step of allowing the plurality of processing units to process the substrate conveyed to the plurality of processing units, and a carrying-out step of allowing the transfer unit to convey the substrate processed by the plurality of processing units from the plurality of processing units to the plurality of load ports. According to this method, it is possible to fulfill the same effects as the aforementioned ones.

The substrate processing method may further include a sixth step of stopping execution of one of the first schedule and the second schedule and allowing the substrate processing apparatus to execute a remaining one of the first schedule and the second schedule. According to this arrangement, it is possible to fulfill the same effects as the aforementioned ones.

Still another preferred embodiment of the present invention provides a substrate processing system including a first substrate processing apparatus that processes a substrate, the substrate processing apparatus, and an intermediate apparatus that conveys a substrate processed by the first substrate processing apparatus between the first substrate processing apparatus and the substrate processing apparatus in a state of directly supporting the substrate outside the first substrate processing apparatus. According to this arrangement, it is possible to fulfill the same effects as the aforementioned ones.

The foregoing and other objects, features and effects of the present invention will become more apparent from the following detailed description of the preferred embodiments with reference to the attached drawings.

BRIEF DESCRIPTION OF THE DRAWINGS

FIG. 8 is a diagram to describe a data structure of a virtual carrier creation command.

FIG. 9 is a diagram to describe a correlation between attribute information of a first carrier and attribute information of a virtual carrier.

MODES FOR CARRYING OUT THE INVENTION

Figure 1:
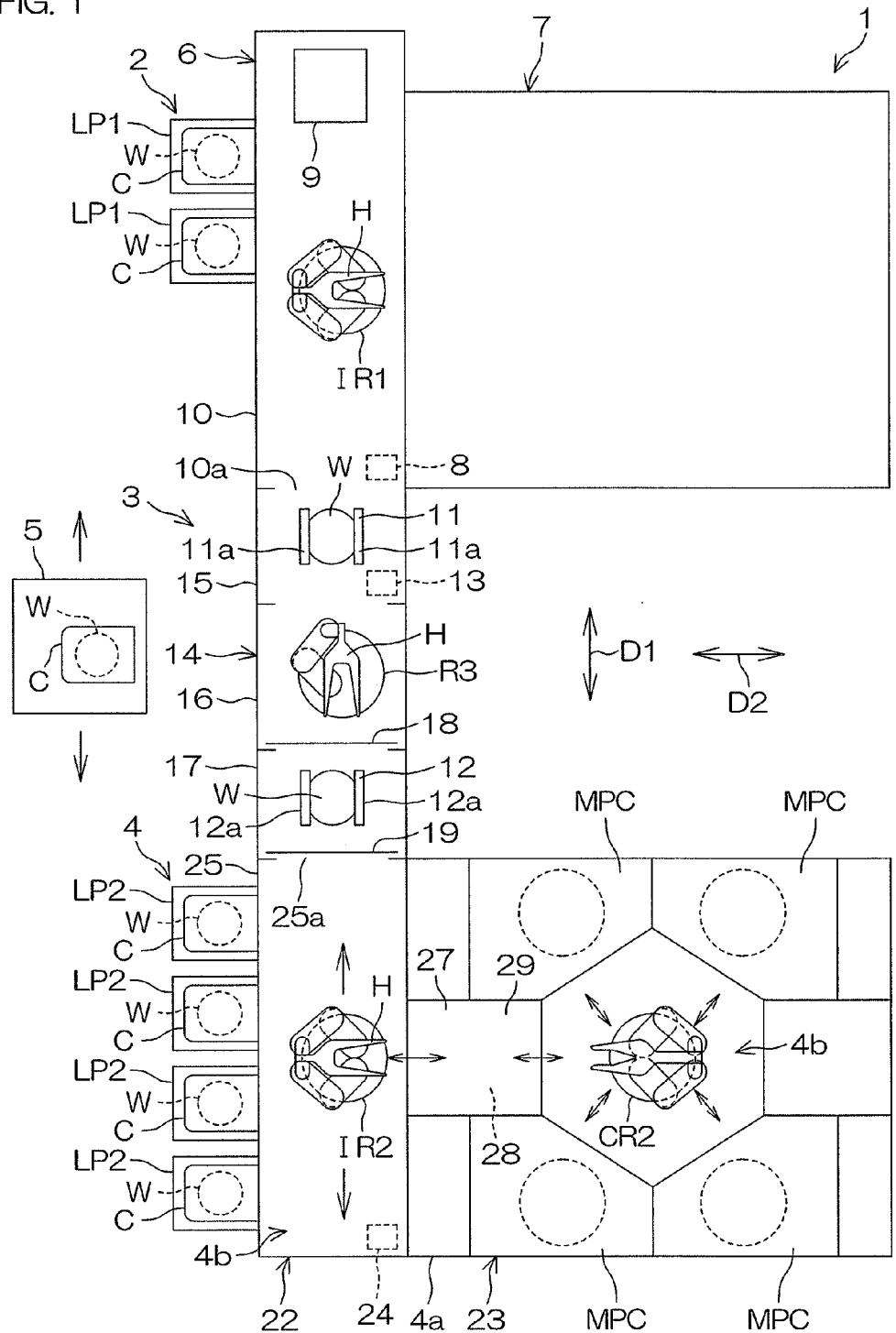
FIG. 1 is a schematic plan view of a substrate processing system 1 according to a preferred embodiment of the present invention.
Figure 2:
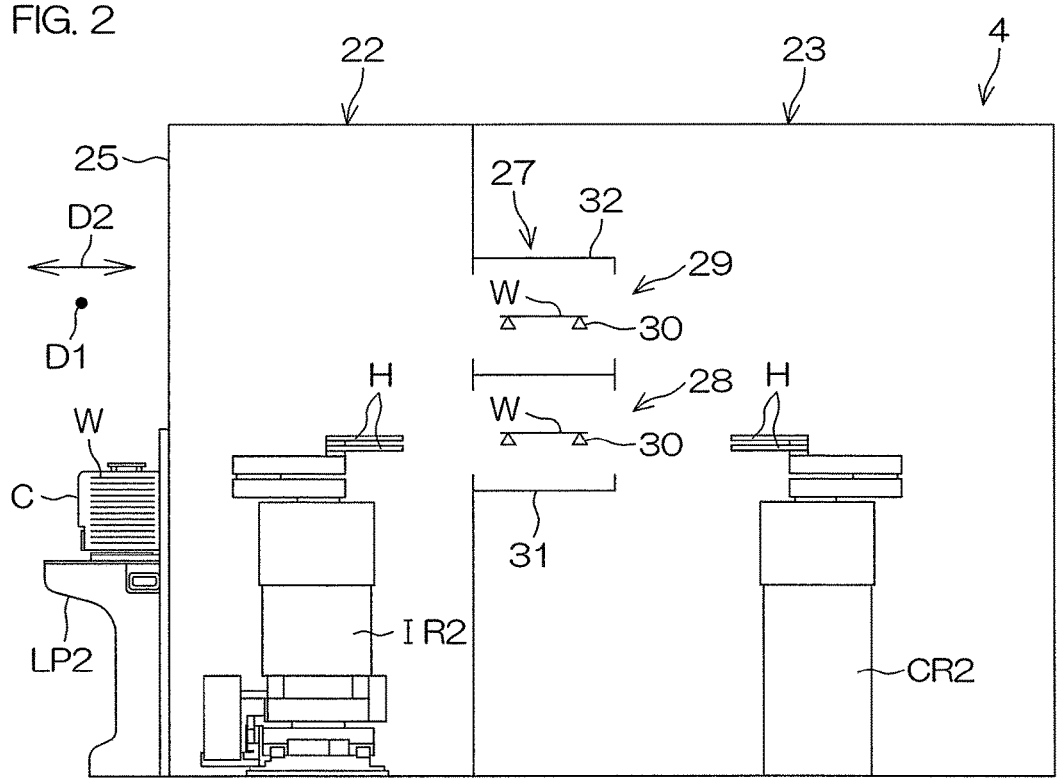
FIG. 2 is a schematic side view showing an arrangement of the inside of a second substrate processing apparatus 4 according to the preferred embodiment of the present invention.
Figure 3:
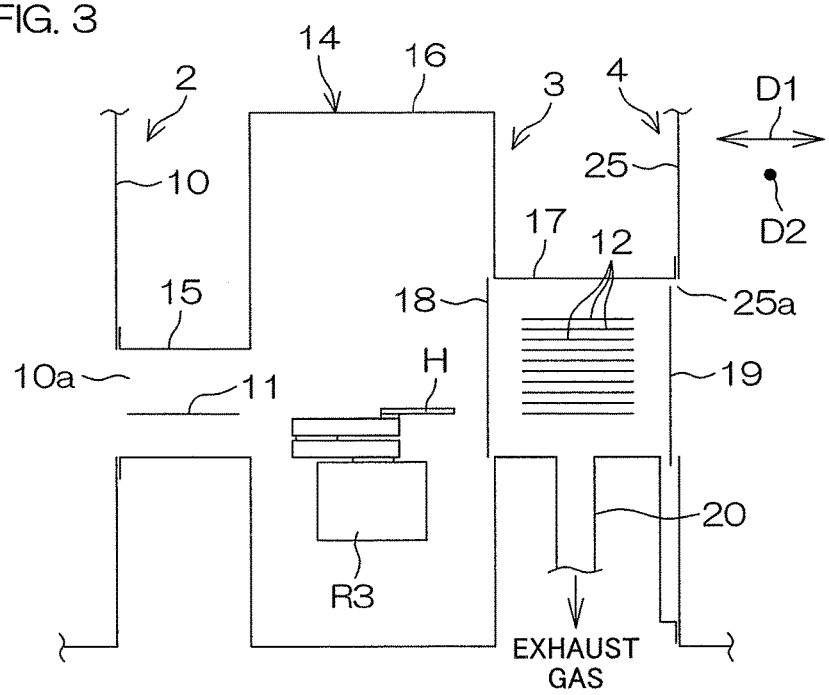
FIG. 3 is a schematic front view showing an arrangement of the inside of an intermediate apparatus 3 according to the preferred embodiment of the present invention.

FIG. 1 is a schematic plan view of a substrate processing system 1 according to a preferred embodiment of the present invention. FIG. 2 is a schematic side view showing an arrangement of the inside of a second substrate processing apparatus 4 according to the preferred embodiment of the present invention. FIG. 3 is a schematic front view showing an arrangement of the inside of an intermediate apparatus 3 according to the preferred embodiment of the present invention.

As shown in FIG. 1, the substrate processing system 1 includes a single substrate processing type first substrate processing apparatus 2 that processes substrates W one by one, a single substrate processing type second substrate processing apparatus 4 that processes substrates W one by one, an intermediate apparatus 3 that connects the first substrate processing apparatus 2 and the second substrate processing apparatus 4 together, and a carrier transfer robot 5 that transfers a carrier C (for example, FUOP) capable of containing a plurality of substrates W to the first substrate processing apparatus 2 and to the second substrate processing apparatus 4. The carrier C has its inner portion having a plurality of slots (shelves) disposed in the up-down direction with intervals therebetween. The carrier C is capable of supporting the substrates W by means of the slots such that the substrates W are stacked together up and down with intervals therebetween in a horizontal posture.

The first substrate processing apparatus 2 may be any of a cleaning apparatus, a heat treatment apparatus, a film formation apparatus, an etching apparatus, a resist applying apparatus, an exposure apparatus, and a developing apparatus, or may be an apparatus that performs other processing operations with respect to the substrate W. The same applies to the second substrate processing apparatus 4. Additionally, the first substrate processing apparatus 2 and the second substrate processing apparatus 4 may be apparatuses that perform the same kind of processing operation with respect to the substrate W, or may be apparatuses that perform mutually-different kind of processing operations with respect to the substrate W. An example will be hereinafter described in which the first substrate processing apparatus 2 is a dry etching apparatus and in which the second substrate processing apparatus 4 is a wet cleaning apparatus that cleans a substrate W, which has undergone dry etching, by use of a cleaning solution, such as a chemical solution or a rinse solution.

As shown in FIG. 1, the first substrate processing apparatus 2 includes a plurality of first load ports LP1 that hold a plurality of carriers C, respectively, in a state of being arranged in a horizontal arrangement direction D1, a single substrate processing type first processing module 7 that processes (dry-etches) substrates W carried out from the carrier C held by the first load port LP1, a first indexer module 6 that transfers substrates W between the first load port LP1, the first processing module 7, and the intermediate apparatus 3, and a first control device 8 that controls the operation of devices provided in the first substrate processing apparatus 2 or controls the opening and closing of valves. The first substrate processing apparatus 2 further includes a first inspection unit 9 that inspects a substrate W that has been processed by the first processing module 7. One example of the first inspection unit 9 is a unit that includes a scanning electron microscope that measures the line width of a pattern formed on the front surface of a substrate W that has been processed (i.e., a substrate W that has undergone dry etching).

As shown in FIG. 1, the first indexer module 6 includes a first indexer robot IR1 serving as a first transfer robot that transfers substrates W in a horizontal posture and a first indexer box 10 that contains the first indexer robot IR1 and the first inspection unit 9. The first indexer box 10 is connected to the first load port LP1, to the first processing module 7, and to the intermediate apparatus 3, and the first processing module 7 and the inside of the intermediate apparatus 3 are connected to the inside of the first indexer box 10. The first indexer robot IR1 carries substrates W into or out of the carrier C, the first processing module 7, the first inspection unit 9, and the intermediate apparatus 3, and substrates W are conveyed between the carrier C, the first processing module 7, the first inspection unit 9, and the intermediate apparatus 3.

The carrier C in which unprocessed substrates W (i.e., substrates W that have not yet been processed by the first substrate processing apparatus 2) are contained is placed on the first load port LP1 by means of the carrier transfer robot 5. A substrate W in the carrier C placed on the first load port LP1 is conveyed from the carrier C to the first processing module 7 through the inside of the first indexer box 10 by means of the first indexer robot IR1. Thereafter, the substrate W that has been processed by the first processing module 7 is conveyed from the first processing module 7 to the first indexer box 10 by means of the first indexer robot IR1. All processed substrates W are carried into the first inspection unit 9 one by one by means of the first indexer robot IR1, and are inspected one by one by means of the first inspection unit 9. Thereafter, the substrates W that have been processed and been inspected are conveyed to the carrier C held by the first load port LP1 or are conveyed to the intermediate apparatus 3 by means of the first indexer robot IR1. Furthermore, the carrier C in which the processed and already-inspected substrates W have been carried is conveyed from the first load port LP1 to the second substrate processing apparatus 4 by means of the carrier transfer robot 5.

As shown in FIG. 1 and FIG. 3, the intermediate apparatus 3 includes an upstream supporting member 11 that is capable of supporting a substrate W carried out of the first substrate processing apparatus 2 in a horizontal posture, a downstream supporting member 12 that is capable of supporting a plurality of substrates W carried into the second substrate processing apparatus 4 in a horizontal posture, an intermediate transfer robot R3 that conveys substrates W in a horizontal posture between the upstream supporting member 11 and the downstream supporting member 12, an intermediate box 14 that contains the upstream supporting member 11, the downstream supporting member 12, and the intermediate transfer robot R3, and an intermediate control device 13 that controls the operation of devices provided in the intermediate apparatus 3 and controls the opening and closing of a valve.

As shown in FIG. 1, the upstream supporting member 11 has two supporting plates 11a that face each other with an interval therebetween in a horizontal orthogonal direction D2 perpendicular to the arrangement direction D1. The two supporting plates 11a are open toward the first indexer robot IR1, and are open toward the intermediate transfer robot R3. A slot (not shown) is formed in the two supporting plates 11a. The first indexer robot IR1 is capable of placing a single substrate W taken out from the first inspection unit 9 at this slot.

As shown in FIG. 1, the downstream supporting member 12 has two supporting plates 12a that face each other with an interval therebetween in the orthogonal direction D2. The two supporting plates 12a are open toward the intermediate transfer robot R3, and are open toward the second substrate processing apparatus 4. A plurality of slots (shelves), e.g., ten slots (shelves), arrayed in the up-down direction with intervals therebetween are provided between the two supporting plates 12a, and a plurality of substrates W can be stacked together up and down with intervals therebetween in a horizontal posture between the two supporting plates 12a. Preferably, the number of slots of the downstream supporting member 12 is equal to the number of slots of a carrier C placed at a second load port LP2 described later.

The intermediate transfer robot R3 carries a substrate W taken out from the upstream supporting member 11 into one of the slots disposed between the two supporting plates 12a of the downstream supporting member 12. The downstream supporting member 12 is capable of holding a plurality of substrates W by means of the slots, and therefore the downstream supporting member 12 is capable of buffering (temporarily holding) a plurality of substrates W.

As shown in FIG. 3, the intermediate box 14 includes an upstream box 15 connected to the first substrate processing apparatus 2, a downstream box 17 connected to the second substrate processing apparatus 4, and a box body 16 connected to the upstream box 15 and the downstream box 17. The intermediate apparatus 3 further includes an upstream shutter 18 that seals up an opening that connects the inside of the box body 16 and the inside of the downstream box 17 each other, a first opening-closing device (not shown) that opens and closes the upstream shutter 18, a downstream shutter 19 that seals up an opening of the downstream box 17 connected to an opening (a direct carry-in entrance 25a) provided in the second substrate processing apparatus 4, a second opening-closing device (not shown) that opens and closes the downstream shutter 19, and an exhaust duct 20 through which gases in the downstream box 17 are discharged.

The upstream shutter 18 is closed except when a substrate W is conveyed from the box body 16 to the downstream box 17. Likewise, the downstream shutter 19 is closed except when a substrate W is conveyed from the downstream box 17 to the second substrate processing apparatus 4. In a state in which the upstream shutter 18 and the downstream shutter 19 are closed, the inside of the downstream box 17 is isolated from the inside of the box body 16 and from the inside of the second substrate processing apparatus 4. In this state, when gases in the downstream box 17 are discharged through the exhaust duct 20, the inside of the downstream box 17 is depressurized. In a state in which the upstream shutter 18 and the downstream shutter 19 are closed, the atmospheric pressure in the downstream box 17 is lower than the atmospheric pressure in the first substrate processing apparatus 2 (than the atmospheric pressure in the first indexer module 6), and is maintained to have a value greater than the atmospheric pressure in the second substrate processing apparatus 4 (than the atmospheric pressure in a second indexer box 25 described later).

As shown in FIG. 1, a substrate W in the first substrate processing apparatus 2 is conveyed and supported by the first indexer robot IR1 from the first inspection unit 9 of the first substrate processing apparatus 2 to the upstream supporting member 11 of the intermediate apparatus 3 through an opening (direct carry-out exit 10a) by which the inside of the first substrate processing apparatus 2 (inside of the first indexer box 10) is allowed to communicate with the inside of the upstream box 15. A substrate W supported by the upstream supporting member 11 is conveyed and supported by the intermediate transfer robot R3 from the upstream supporting member 11 to the downstream supporting member 12 in a horizontal posture in a state in which the upstream shutter 18 is opened. Thereafter, the substrate W supported by the downstream supporting member 12 is conveyed by a second indexer robot IR2 (described later) of the second substrate processing apparatus 4 from the downstream supporting member 12 to the second substrate processing apparatus 4 in a state in which the downstream shutter 19 is opened. As a result, the substrate W is conveyed from the first substrate processing apparatus 2 to the second substrate processing apparatus 4 through the intermediate apparatus 3.

As shown in FIG. 1, the second substrate processing apparatus 4 is provided with a housing 4a and a plurality of second load ports LP2. The plurality of second load ports LP2 that hold a plurality of carriers C, respectively, are connected to the housing 4a in a state of being arrayed in the arrangement direction D1. Furthermore, a second processing module 23 that processes (cleans) a substrate W carried out from the carrier C held by the second load port LP2 and a second indexer module 22 that conveys a substrate W between the carrier C held by the second load port LP2, the second processing module 23, and the intermediate apparatus 3 are disposed in a management area 4b inside the housing 4a. The second substrate processing apparatus 4 additionally has a second control device 24 that controls the operation of devices provided in the second substrate processing apparatus 4 and controls the opening and closing of a valve.

As shown in FIG. 1, the second indexer module 22 includes the second indexer robot IR2 serving as a second transfer robot that transfers a substrates W in a horizontal posture at the inside of a management area 4b and the second indexer box 25 that contains the second indexer robot IR2. The second indexer robot IR2, a second center robot CR2 described later, and a temporarily-holding unit 27 described later are an example of a second transfer unit.

The second indexer box 25 is connected to the second load port LP2, to the second processing module 23, and to the intermediate apparatus 3, and the second processing module 23 and the inside of the intermediate apparatus 3 are connected to the inside of the second indexer box 25. The direct carry-in entrance 25a through which the inside of the second indexer box 25 and the inside of the intermediate box 14 are connected together is sealed up by the downstream shutter 19, and is opened and closed by the downstream shutter 19. The second indexer robot IR2 carries a substrate W into or out of the carrier C, the second processing module 23, and the intermediate apparatus 3, and conveys the substrate W between the carrier C, the second processing module 23, and the intermediate apparatus 3.

As shown in FIG. 1 and FIG. 2, the second indexer robot IR2 is provided with two hands H disposed at mutually different heights. FIG. 1 shows a state in which the two hands H coincide with each other when viewed planarly. The second indexer robot IR2 moves the hands H in the horizontal direction and in the vertical direction at the inside of a management area 4b. Additionally, the second indexer robot IR2 changes the direction of the hands H by rotating around the vertical axis (by rotating around its own axis). Still additionally, the second indexer robot IR2 moves in the arrangement direction D1 along a route passing through a receiving/delivering position (position shown in FIG. 1). The receiving/delivering position is a position at which the second indexer robot IR2 and the second processing module 23 (the temporarily-holding unit 27 described later) face each other in the orthogonal direction D2 when viewed planarly.

The second indexer robot IR2 allows the hands H to face an arbitrary carrier C placed on the second load port LP2 by moving the hands H in the horizontal direction and in the vertical direction and by moving in the arrangement direction D1. Likewise, the second indexer robot IR2 allows the hands H to face the second processing module 23 (the temporarily-holding unit 27 described later) or to face the downstream supporting member 12 of the intermediate apparatus 3 by moving the hands H in the horizontal direction and in the vertical direction. The second indexer robot IR2 carries a substrate W into or out of any one of the carrier C, the second processing module 23, and the intermediate apparatus 3 by moving the hands H in the horizontal direction and in the vertical direction in a state in which the hands H face any one of the carrier C, the second processing module 23, and the intermediate apparatus 3.

As shown in FIG. 1, the second processing module 23 is provided with a plurality of single substrate processing type second processing units MPC that process (clean) substrates W carried out of the carrier C by means of the second indexer module 22 one by one. FIG. 1 shows an example in which twelve second processing units MPC are disposed in the second processing module 23. The second processing module 23 is additionally provided with the second center robot CR2 that conveys a substrate W in a horizontal posture in the second processing module 23 and the temporarily-holding unit 27 that temporarily holds a substrate W conveyed from a carrier C held by the second load port LP2 or from the intermediate apparatus 3. The second indexer robot IR2, the second center robot CR2, and the temporarily-holding unit 27 are an example of the second transfer unit.

As shown in FIG. 1, the twelve second processing units MPC are disposed at four positions surrounding the second center robot CR2 when viewed planarly. The twelve second processing units MPC form four towers each of which includes three second processing units MPC stacked together up and down. The four towers form two rows arranged in the orthogonal direction D2 when viewed planarly. Two towers that form one of the two rows horizontally face two towers that form the other row, respectively, with intervals therebetween in the arrangement direction D1. The second center robot CR2 is disposed between the four towers in the arrangement direction D1. The temporarily-holding unit 27 is disposed between the receiving/delivering position of the second indexer robot IR2 and the second center robot CR2 when viewed planarly. The temporarily-holding unit 27 and the second center robot CR2 face each other in the orthogonal direction D2 when viewed planarly.

As shown in FIG. 2, the temporarily-holding unit 27 includes a relay unit 28 that relays a substrate W between the second indexer robot IR2 and the second center robot CR2 and an evacuation unit 29 that temporarily evacuates a substrate W carried out from the intermediate apparatus 3. The relay unit 28 and the evacuation unit 29 are arranged in the up-down direction, and coincide with each other when viewed planarly. FIG. 2 shows an example in which the relay unit 28 is disposed under the evacuation unit 29. The relay unit 28 may be disposed over the evacuation unit 29.

As shown in FIG. 2, the relay unit 28 includes one or more supporting members 30 that support a substrate W in a horizontal posture by coming into contact with the peripheral edge of the lower surface of the substrate W and a relay box 31 that contains a substrate W supported by the supporting member 30. The relay box 31 includes an opening that is open toward the second indexer robot IR2 and an opening that is open toward the second center robot CR2. The second indexer robot IR2 conveys a substrate W between the inside of the relay box 31 and the outside of the relay box 31 through the opening that is open toward the second indexer robot IR2. Likewise, the second center robot CR2 conveys a substrate W between the inside of the relay box 31 and the outside of the relay box 31 through the opening that is open toward the second center robot CR2.

As shown in FIG. 2, the evacuation unit 29 includes one or more supporting members 30 that support a substrate W in a horizontal posture by coming into contact with the peripheral edge of the lower surface of the substrate W and an evacuation box 32 that contains a substrate W supported by the supporting member 30. The evacuation box 32 includes an opening that is open toward the second indexer robot IR2 and an opening that is open toward the second center robot CR2. The second indexer robot IR2 conveys a substrate W between the inside of the evacuation box 32 and the outside of the evacuation box 32 through the opening that is open toward the second indexer robot IR2. Likewise, the second center robot CR2 conveys a substrate W between the inside of the evacuation box 32 and the outside of the evacuation box 32 through the opening that is open toward the second center robot CR2.

As shown in FIG. 1 and FIG. 2, the second center robot CR2 is provided with two hands H disposed at mutually different heights. FIG. 1 shows a state in which the two hands H coincide with each other when viewed planarly. The second center robot CR2 moves the hands H in the horizontal direction and in the vertical direction. Additionally, the second center robot CR2 changes the direction of the hands H by rotating around the vertical axis (by rotating around its own axis). A base portion of the second center robot CR2 is fixed to the second substrate processing apparatus 4, and is immovable to the second substrate processing apparatus 4. The second center robot CR2 may be movable in the orthogonal direction D2.

The second center robot CR2 allows the hands H to face an arbitrary second processing unit MPC by moving the hands H in the horizontal direction and in the vertical direction. Likewise, the second center robot CR2 allows the hands H to face the relay unit 28 or the evacuation unit 29 by moving the hands H in the horizontal direction and in the vertical direction. The second center robot CR2 carries a substrate W into or out of any one of the second processing unit MPC, the relay unit 28, and the evacuation unit 29 by moving the hands H in the horizontal direction and in the vertical direction in a state in which the hands H face any one of the second processing unit MPC, the relay unit 28, and the evacuation unit 29.

The carrier C in which unprocessed substrates W (substrates W that have not yet been processed by the second substrate processing apparatus 4) are contained is placed on the second load port LP2 by means of the carrier transfer robot 5. A substrate W in the carrier C placed on the second load port LP2 is conveyed from the inside of the carrier C to the inside of the second indexer box 25 by means of the second indexer robot IR2. Thereafter, the substrate W that has been conveyed into the second indexer box 25 is conveyed from the inside of the second indexer box 25 to the inside of the relay box 31 by means of the second indexer robot IR2, and is placed and supported on the supporting member 30 of the relay unit 28. The substrate W supported in a horizontal posture by means of the relay unit 28 is conveyed from the inside of the relay box 31 to the inside of the second processing unit MPC by means of the second center robot CR2, and is processed (cleaned) by the second processing unit MPC. Thereafter, the already-processed substrate W is conveyed from the second processing unit MPC to the relay unit 28 by means of the second center robot CR2, and is conveyed from the relay unit 28 to the carrier C held by the second load port LP2 by means of the second indexer robot IR2.

An unprocessed substrate W (a substrate W that has not yet been processed by the second substrate processing apparatus 4) supported by the downstream supporting member 12 of the intermediate apparatus 3 is conveyed from the inside of the intermediate apparatus 3 to the inside of the second indexer box 25 by means of the second indexer robot IR2 in a state in which the downstream shutter 19 is opened. Thereafter, the substrate W that has been conveyed into the second indexer box 25 is conveyed from the inside of the second indexer box 25 to the inside of the relay box 31 or to the inside of the evacuation box 32 by means of the second indexer robot IR2, and is placed on the supporting member 30 in the relay box 31 or in the evacuation box 32. The substrate W that has been conveyed into the evacuation box 32 is conveyed to the carrier C held by the second load port LP2 from the evacuation unit 29 by means of the second indexer robot IR2 without being conveyed via the second processing unit MPC. The substrate W that has been conveyed into the relay box 31 is conveyed from the inside of the relay box 31 to the inside of any one of the second processing units MPC by means of the second center robot CR2, and is processed by the second processing unit MPC. Thereafter, the substrate W that is processed by the second processing unit MPC is conveyed from the second processing unit MPC to the relay unit 28 by means of the second center robot CR2, and is conveyed to the carrier C held by the second load port LP2 from the relay unit 28 by means of the second indexer robot IR2.

Figure 4:
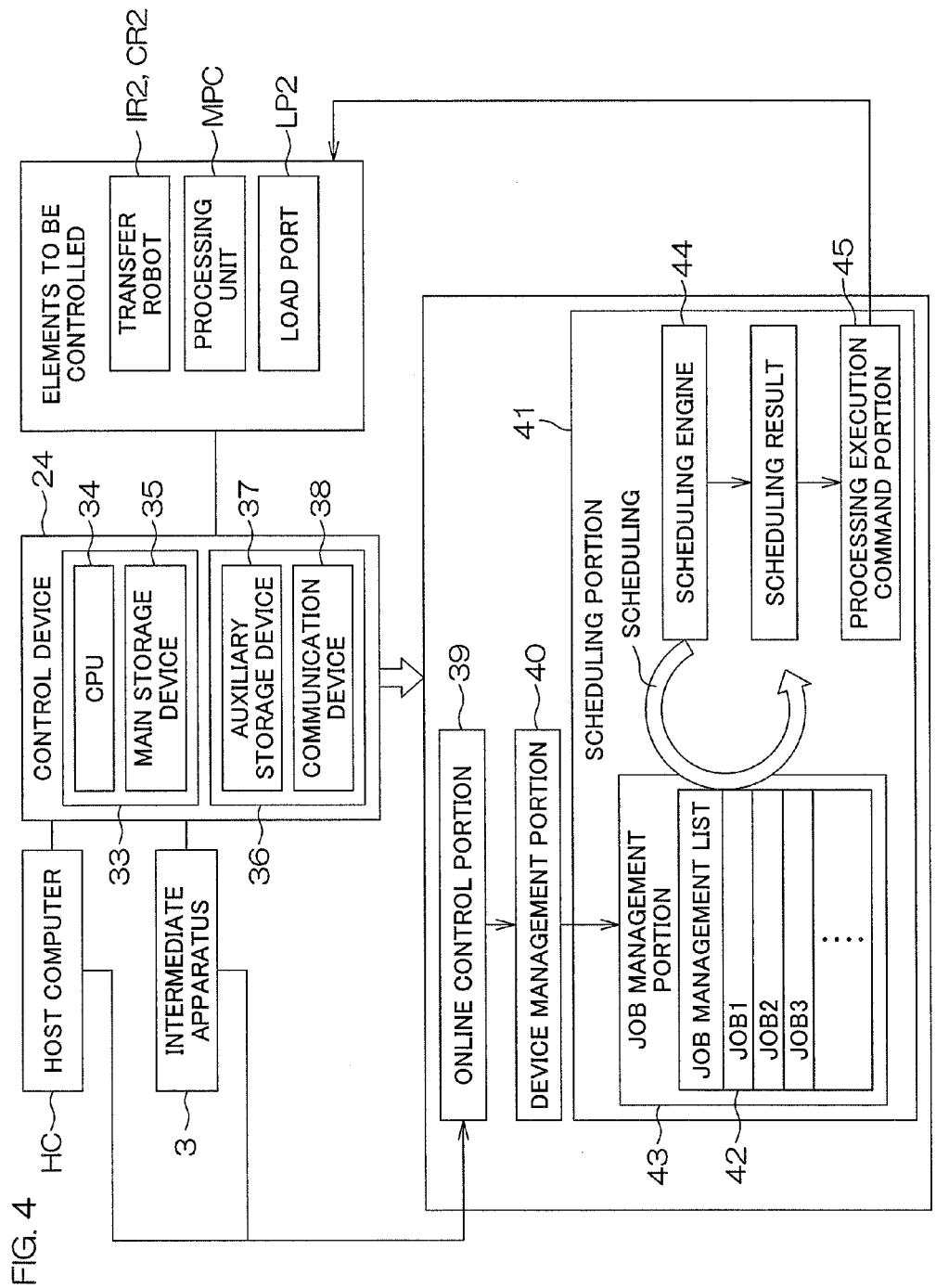
FIG. 4 is a block diagram to describe an electric arrangement of the second substrate processing apparatus 4.

FIG. 4 is a block diagram to describe an electric arrangement of the second substrate processing apparatus 4.

As shown in FIG. 4, the second control device 24 is connected to a plurality of devices, such as the intermediate apparatus 3, that are provided in the second substrate processing apparatus 4. The second control device 24 is further connected to devices, such as a host computer HC, excluding the second substrate processing apparatus 4. The second control device 24 includes a computer body 33 and a peripheral device 36 connected to the computer body 33. The computer body 33 includes a CPU (central processing unit) 34 that executes programs and a main storage device 35 connected to the CPU 34. The peripheral device 36 includes an auxiliary storage device 37 connected to the main storage device 35 and a communication device 38 that communicates with the host computer HC and so on.

As shown in FIG. 4, the second control device 24 includes an online control portion 39 that communicates with a plurality of devices, such as the host computer HC, the intermediate apparatus 3, and the second load port LP2, a device management portion 40 that relays a command transmitted to the online control portion 39, and a scheduling portion 41 that creates a schedule to convey and/or process a substrate W in accordance with a command sent from the device management portion 40 and that operates a resource of the second substrate processing apparatus 4 in accordance with the created schedule. The online control portion 39, the device management portion 40, and the scheduling portion 41 are a functional block realized by allowing the CPU 34 to execute programs stored in the auxiliary storage device 37.

As shown in FIG. 4, the scheduling portion 41 includes a job management portion 43 that manages a job management list 42 in which the identification information of jobs correlated to substrates W carried into the second substrate processing apparatus 4 is registered in accordance with a predetermined priority, a scheduling engine 44 that creates a schedule to convey and/or process substrates W correlated to jobs registered in the job management list 42 in order from a job having the highest priority among the jobs, and a processing execution command portion 45 that allows each of the resources of the second substrate processing apparatus 4 to execute the conveyance and/or the processing of a substrate W by operating the controlled elements of the second substrate processing apparatus 4 such as the transfer robots IR2 and CR2, the second processing unit MPC and the second load port LP2 in accordance with a plan (scheduling result) created by the scheduling engine 44.

The auxiliary storage device 37 stores a plurality of pieces of substrate processing information (hereinafter, referred to as "recipe") that define the contents of substrate processing. The recipe includes recipe-identification information, substrate processing conditions, and substrate processing procedures. In more detail, the recipe includes concurrent processing unit information, to-be-used processing liquid information, processing time information, etc. The concurrent processing unit information is information that specifies second processing units MPC that are usable, and shows that concurrent processing can be performed by second processing units MPC that have been specified. In other words, when one of the specified processing units is unusable, this state shows that it is replaceable by the other specified processing units. The term "when a processing unit is unusable" denotes the time when the second processing unit MPC is in use for processing another substrate W, the time when the second processing unit MPC is in trouble, the time when an operator does not want the processing of a substrate W by means of the second processing unit MPC, and so on.

As described later, identification information of a recipe is transmitted to the second control device 24 from the host computer HC. The scheduling portion 41 selects a recipe corresponding to the identification information of the recipe transmitted from the host computer HC from among a plurality of recipes stored in the auxiliary storage device 37, and reads the recipe selected therefrom. Thereafter, the scheduling portion 41 creates a schedule to process the substrate W in accordance with a substrate processing condition and a substrate processing procedure included in the read recipe, and allows the resource of the second substrate processing apparatus 4 to execute a created schedule. As a result, a plurality of substrate processing steps (for example, a processing liquid supplying step and a drying step) are performed under substrate processing conditions specified by the recipe and in a substrate processing procedure specified by the recipe.

Figure 5:
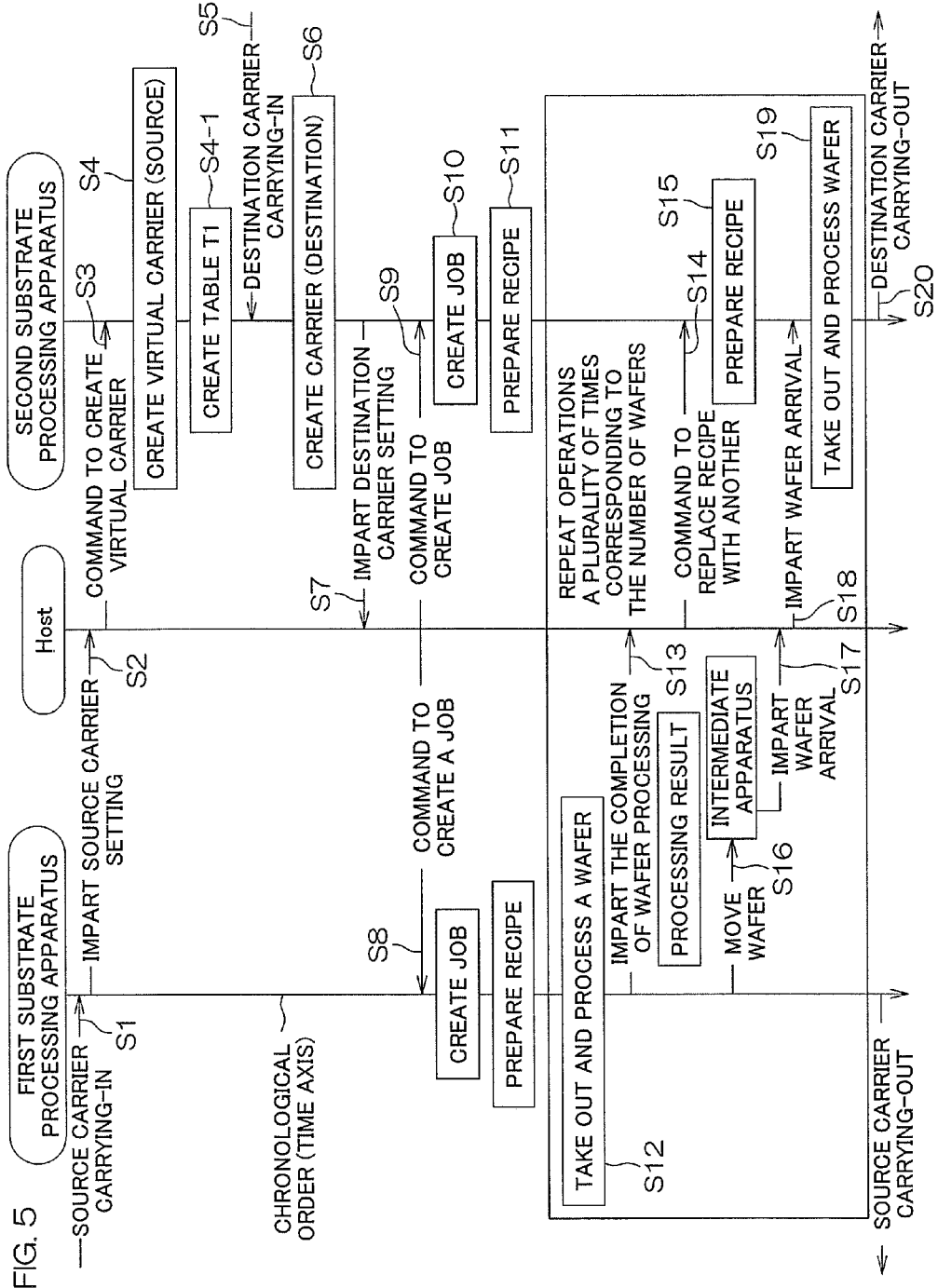
FIG. 5 is a flowchart when a substrate W is processed by a first substrate processing apparatus 2 and the second substrate processing apparatus 4.

FIG. 5 is a flowchart when a substrate W is processed by the first substrate processing apparatus 2 and by the second substrate processing apparatus 4.

When a carrier C1 in which an unprocessed substrate W (a substrate W that has not yet been processed by the first substrate processing apparatus 2) is contained is placed on the first load port LP1 by means of the carrier transfer robot 5 (step S1), the first control device 8 of the first substrate processing apparatus 2 transmits first carrier setting information to the host computer HC (step S2), and imparts the fact that the carrier C1 has been set up to the host computer HC. The first carrier setting information includes identification information of the first carrier C1, identification information of the first load port LP1 in which the first carrier C1 has been set up, and first slot information. The first slot information is information that shows any one of the slots of the first carrier C1 in which an unprocessed substrate W is disposed, and includes information showing an insertion state of an unprocessed substrate W of each slot and substrate identification information of an unprocessed substrate W inserted in each slot. Therefore, the information that an unprocessed substrate W is disposed at "any one of the slots" of "any one of the carriers" placed at "any one of the first load ports LP1" is recognized by the host computer HC, i.e., the positional information of a specific substrate W is recognized by the host computer HC.

Figure 7:
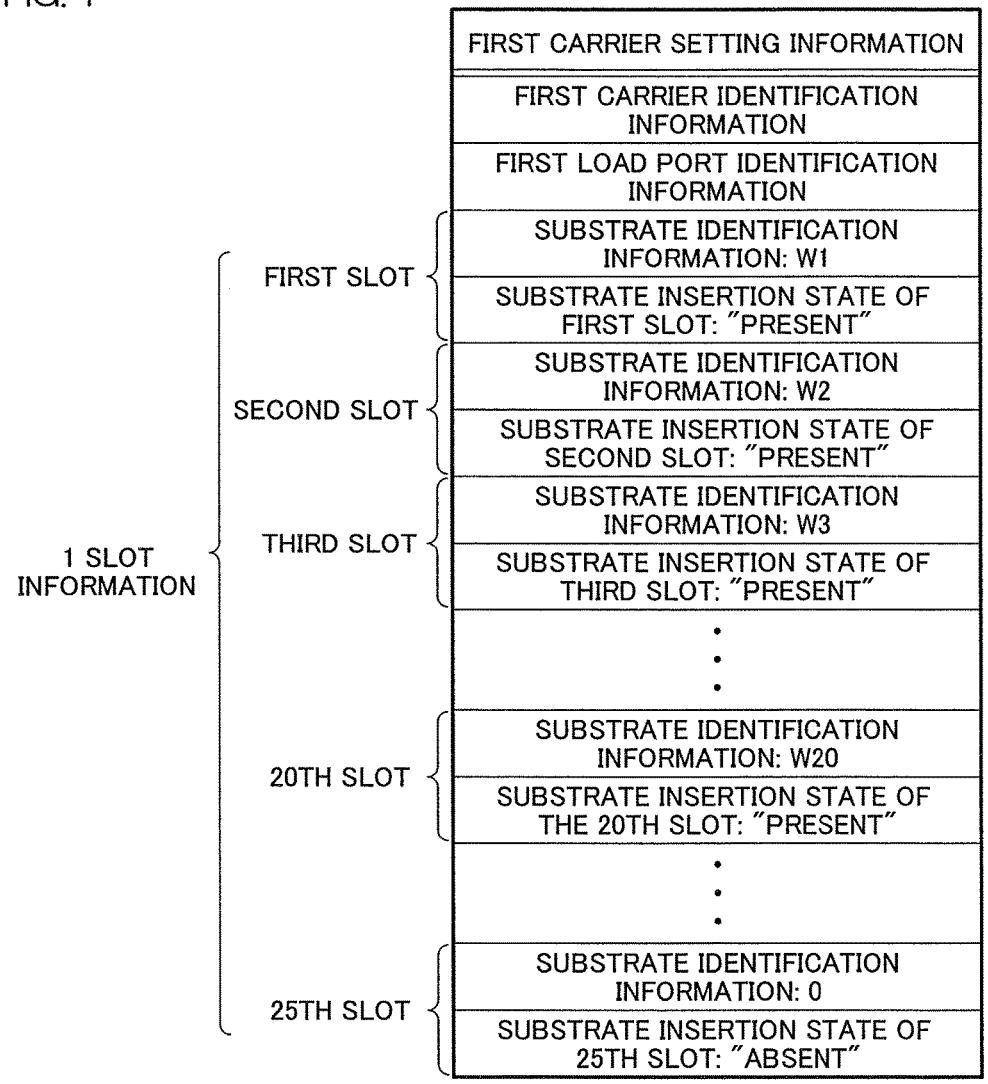
FIG. 7 is a diagram to describe a data structure of first carrier setting information.

FIG. 7 is a diagram showing the contents of the first carrier setting information. The first carrier C1 has twenty-five slots, and therefore the first carrier setting information is capable of showing the insertion state of a substrate W in each of the twenty-five slots. In the present preferred embodiment, let it be supposed that twenty substrates (W1 to W20) are inserted in twenty slots, respectively, of the twenty-five slots.

When the fact that the carrier C1 has been set up is imparted from the first control device 8, the host computer HC transmits a first virtual carrier creation command to the second control device 24 (step S3), and commands the second control device 24 to create the first carrier C1 set up at the first load port LP1, i.e., a first virtual carrier VC1 corresponding to a carrier that does not exist in the second substrate processing apparatus 4. The first virtual carrier creation command includes identification information of the first carrier C1, identification information of the first load port LP1 in which the first carrier C1 has been set up, and first slot information that shows the position of a slot in which a substrate W has been inserted among the slots of the first carrier C1. In other words, the same information as the first carrier setting information is included in the first virtual carrier creation command (see FIG. 8).

The second control device 24 receives a first virtual carrier creation command from the host computer HC, and creates a first virtual carrier VC1 in the second control device 24 (step S4). The first virtual carrier VC1 is a virtual carrier conveniently created by the second control device 24, and does not exist in the second substrate processing apparatus 4. The second control device 24 further creates attribute information of the virtual carrier VC1 as follows. In other words, suitable carrier identification information VCR1 ID is given to the first virtual carrier VC1. The second control device 24 further creates a virtual load port VLP (e.g., fifth load port LP1 that does not exist actually) at which the virtual carrier VC1 is assumed as being placed, and gives suitable virtual load port identification information to this.

Thereafter, the second control device 24 correlates the first carrier identification information and the virtual carrier identification information with each other, and correlates the LP1 identification information and the virtual load port identification information with each other, and hence creates a table T1 shown in FIG. 9 and stores in an internal memory (step S4-1).

The reason why the second control device 24 creates a virtual carrier and attribute information of the virtual carrier is as follows.

Information on the departure position and the destination position of an unprocessed substrate W that is a target of a job is needed to create information (job) that determines the contents of conveyance and/or processing of a substrate in the substrate processing apparatus. More specifically, information (departure carrier identification information and departure load port identification information) to identify a carrier (departure carrier) in which an unprocessed substrate has been contained is needed. Likewise, information (destination carrier identification information and destination load port information) to identify a carrier (destination carrier) that should contain a processed substrate is needed.

In an ordinary processing operation, a departure carrier and a destination carrier are placed at a load port of the substrate processing apparatus, and departure carrier identification information, departure load port identification information and destination carrier identification information, destination load port identification information are transmitted from the host computer to the control device of the substrate processing apparatus, and then a job starts to be created.

Although the substrate processing system 1 according to the present preferred embodiment has the first substrate processing apparatus 2 and the second substrate processing apparatus 4, the job of each substrate processing apparatus (the first substrate processing apparatus 2 and the second substrate processing apparatus 4) is created by the control unit of each apparatus mutually independently. It is also possible to convey a substrate from the first substrate processing apparatus 2 to the second substrate processing apparatus 4 not by means of a carrier but in an online manner through the intermediate apparatus 3. When an unprocessed substrate is carried into the second substrate processing apparatus 4 through the intermediate apparatus 3, a carrier is not used. When an unprocessed substrate is carried into the second substrate processing apparatus 4 without using a carrier, it is impossible for the second control device 24 to specify the departure position of the substrate for the second substrate processing apparatus 4 based on information on an actual departure carrier.

Therefore, the second substrate processing apparatus 4 creates information showing the position of the departure carrier for the apparatus 4 in the recognizable form of the second control device 24. In other words, the second control device 24 creates the aforementioned virtual carrier identification information, virtual load port identification information. This makes it possible for the second control device 24 to create a job to convey and/or process a substrate in the second substrate processing apparatus 4 even when an unprocessed substrate is carried into the second substrate processing apparatus 4 without using a carrier.

For the foregoing reasons, the second control device 24 creates a virtual carrier VCR and attribute information of the virtual carrier (virtual carrier identification information and virtual load port identification information) corresponding to a carrier C placed at the load port LP1 of the first substrate processing apparatus 2.

On the other hand, when a second carrier C2 for containing a substrate W processed by the second substrate processing apparatus 4 is placed on the second load port LP2 by means of the carrier transfer robot 5 (step S5), the second control device 24 creates the second carrier C2 placed on the second load port LP2 inside the second control device 24 (step S6). Furthermore, the second control device 24 transmits second carrier setting information to the host computer HC (step S7), and imparts the fact that the second carrier C2 has been set up to the host computer HC. The second carrier setting information includes identification information of the second carrier C2, identification information of the second load port LP2 in which the second carrier C has been set up, and second slot information (slot map) showing the position of a slot in which a substrate W is not inserted among the slots of the second carrier C2.

As described later, the second control device 24 creates a schedule to convey a substrate W from the first virtual carrier VC1 to the second carrier C2 inside the second control device 24, and allows the second substrate processing apparatus 4 to execute this schedule. When the first carrier setting information and the second carrier setting information are received by the host computer HC, the host computer HC transmits a first job creation command to the first control device 8 (step S8), and commands the first control device 8 to create a job. The first job creation command includes identification information of a job, identification information of a recipe, identification information of a carrier (herein, the first carrier C1) that contains a substrate W to be processed, first slot information showing any one of the slots of the carrier in which a substrate W is inserted, identification information of a carrier (herein, the second carrier C2) that contains an already-processed substrate W, and second slot information showing any one of the slots of the carrier in which a substrate W should be contained.

Likewise, when the first carrier setting information and the second carrier setting information are received by the host computer HC, the host computer HC transmits a second job creation command (JobCreate) to the second control device 24 (step S9), and commands the second control device 24 to create a job. The job is created by defining unprocessed substrates W stored in the departure carrier C1 as a unit. The second job creation command includes identification information of a job, substrate identification information to identify an unprocessed substrate that is a target of the job, and identification information of a recipe that should be applied to each unprocessed substrate.

Figure 10:
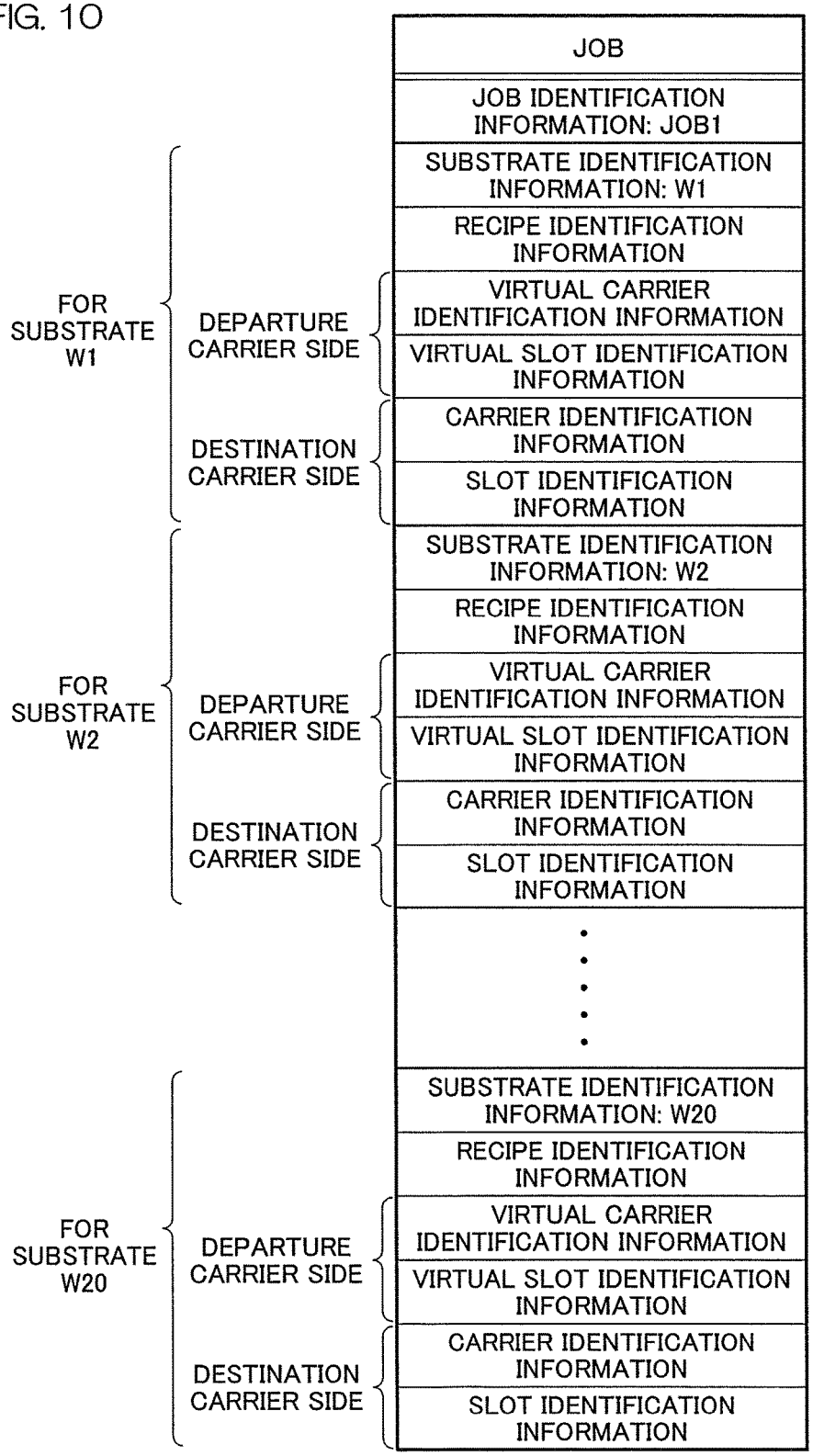
FIG. 10 is a diagram to describe a data structure of a job.

When the second job creation command transmitted from the host computer HC is received by the second control device 24, the second control device 24 creates a job Job 1 having a data structure shown in FIG. 10 inside the second control device 24 by use of the table T1 created in step S4-1 and the second job creation command (step S10). The job Job 1 consists of job ID and a plurality of PJs (process jobs) correlated to a plurality of unprocessed substrates W, respectively. This job is a job to process twenty unprocessed substrates (W1 to W20) stored in the first carrier C1, and therefore twenty process jobs (PJ1 to PJ20) in total are included in the job Job 1. Each of the process jobs PJ1 to PJ20 consists of substrate identification information to identify an unprocessed substrate W to be processed, recipe identification information to identify the recipe of the unprocessed substrate W to be processed, departure carrier identification information to identify the departure position of the unprocessed substrate to be processed (herein, virtual carrier identification information is set), slot identification information (herein, virtual slot identification information is set), and destination carrier identification information, slot identification information to identify the destination position of an already-processed substrate W. The virtual carrier identification information is created from the first carrier identification information included in the virtual carrier creation command with reference to table T1. In table T1, the virtual carrier VCR is correlated to the first carrier C1, and therefore identification information VCR1 ID of the virtual carrier VCR corresponding to the first carrier C1 is set as departure carrier identification information. Additionally, dummy data is uniformly set as virtual slot identification information.

At this point of time, the first carrier C1 that stores the unprocessed substrates W1 to W20 is placed outside the second substrate processing apparatus 4, and this is a place at which the second control device 24 cannot recognize the first carrier C1, and therefore it is impossible to use the attribute information of the first carrier C1 as start points of the unprocessed substrates W1 to W20. The attribute information of the first carrier C1 is converted into the attribute information of a virtual carrier, thereby making it possible to create a job having the data structure of FIG. 10 concerning the unprocessed substrates W1 to W20 at the point of time at which these unprocessed substrates W1 to W20 are positioned at an apparatus differing from the second substrate processing apparatus 4.

Each PJ includes identification information of a recipe specified by a second job creation command. There is a case in which substrates W are mutually different in the contents of a recipe or are the same as each other therein. The second control device 24 selects a recipe corresponding to the identification information of a recipe specified by a job (PJ) from among a plurality of recipes stored in the auxiliary storage device 37, and loads the selected recipe into the main storage device 35. As a result, recipes corresponding to a plurality of substrates W are prepared by the second control device 24 (step S11).

As described above, according to the present preferred embodiment, with respect to the second control device 24, the first carrier C1 disposed in the first substrate processing apparatus 2 is specified as a departure carrier. Additionally, the second carrier C2 disposed in the second substrate processing apparatus 4 is specified as a destination carrier. Therefore, with respect to the second substrate processing apparatus 4, a command is given to convey a substrate W from the first carrier C1 disposed in the first substrate processing apparatus 2 that is an apparatus differing from the second substrate processing apparatus 4 to the second carrier C2 disposed in the second substrate processing apparatus 4.

The first control device 8 allows a resource, such as the first indexer module 6 or the first processing module 7, that is provided in the first substrate processing apparatus 2 to convey a substrate W contained in the first carrier C held by the first load port LP1 to the first processing module 7, and allows the first processing module 7 to process the substrate W (step S12). Thereafter, the already-processed substrate W is inspected by the first inspection unit 9, and then the first control device 8 allows the resource of the first substrate processing apparatus 2 to convey the substrate W to the intermediate apparatus 3. If a plurality of substrates W are contained in the first carrier C, the first control device 8 allows the resource of the first substrate processing apparatus 2 to repeatedly perform these operations. When the processing and the inspection of the substrates W are completed, the first control device 8 furthermore transmits first processing result information to the host computer HC with respect to each substrate W (step S13), and informs the host computer HC of the fact that the processing and the inspection of the substrates W have been completed. The first processing result information includes inspection information that shows inspection results in the first inspection unit 9.

When the first processing result information is received by the host computer HC, the host computer HC selects identification information of a recipe corresponding to the inspection information. Thereafter, the host computer HC transmits a recipe replacement command including the identification information of the selected recipe to the second control device 24 (step S14), and allows the second control device 24 to change the identification information of the present recipe specified by a job (PJ) to the identification information of the selected recipe. Therefore, the second control device 24 selects a recipe corresponding to the identification information of the replaced recipe from among a plurality of recipes stored in the auxiliary storage device 37, and loads the selected recipe into the main storage device 35. As a result, the contents of a recipe in the Job that has already been prepared is replaced with the contents of another recipe, and a Job including a recipe that reflects inspection results is prepared by the second control device 24 for each substrate W (step S15).

If a job for each of the unprocessed substrates W1 to W20 in step S14 is not created inside the second control device 24, the second control device 24 cannot correct a job based on a recipe replacement command acquired in step S14. In the present preferred embodiment, jobs for the unprocessed substrates W1 to W20 are created inside the second control device 24 prior to step S14, and therefore the second control device 24 is capable of dealing with the recipe replacement command sent from the host computer HC before an unprocessed substrate actually reaches the second substrate processing apparatus 4.

If a plurality of substrates W are contained in the first carrier C set up at the first load port LP1, the first control device 8 allows the first indexer robot IR1 to convey a plurality of substrates W that have been processed and inspected from the first substrate processing apparatus 2 to the upstream supporting member 11 of the intermediate apparatus 3 one by one. The intermediate control device 13 allows the intermediate transfer robot R3 to convey a substrate W placed on the upstream supporting member 11 by means of the first indexer robot IR1 to any one of the slots of the downstream supporting member 12 (step S16). When the intermediate transfer robot R3 inserts the substrate W into any one of the slots of the downstream supporting member 12, the intermediate control device 13 transmits substrate arrival information to the host computer HC (step S17), and informs the host computer HC of the fact that the substrate W has arrived near the second substrate processing apparatus 4. The substrate arrival information includes substrate identification information of the substrate W that is inserted into the slots of the downstream supporting member 12, identification information of the downstream supporting member 12, and slot identification information of the slot into which the substrate W is inserted.

Figure 11:
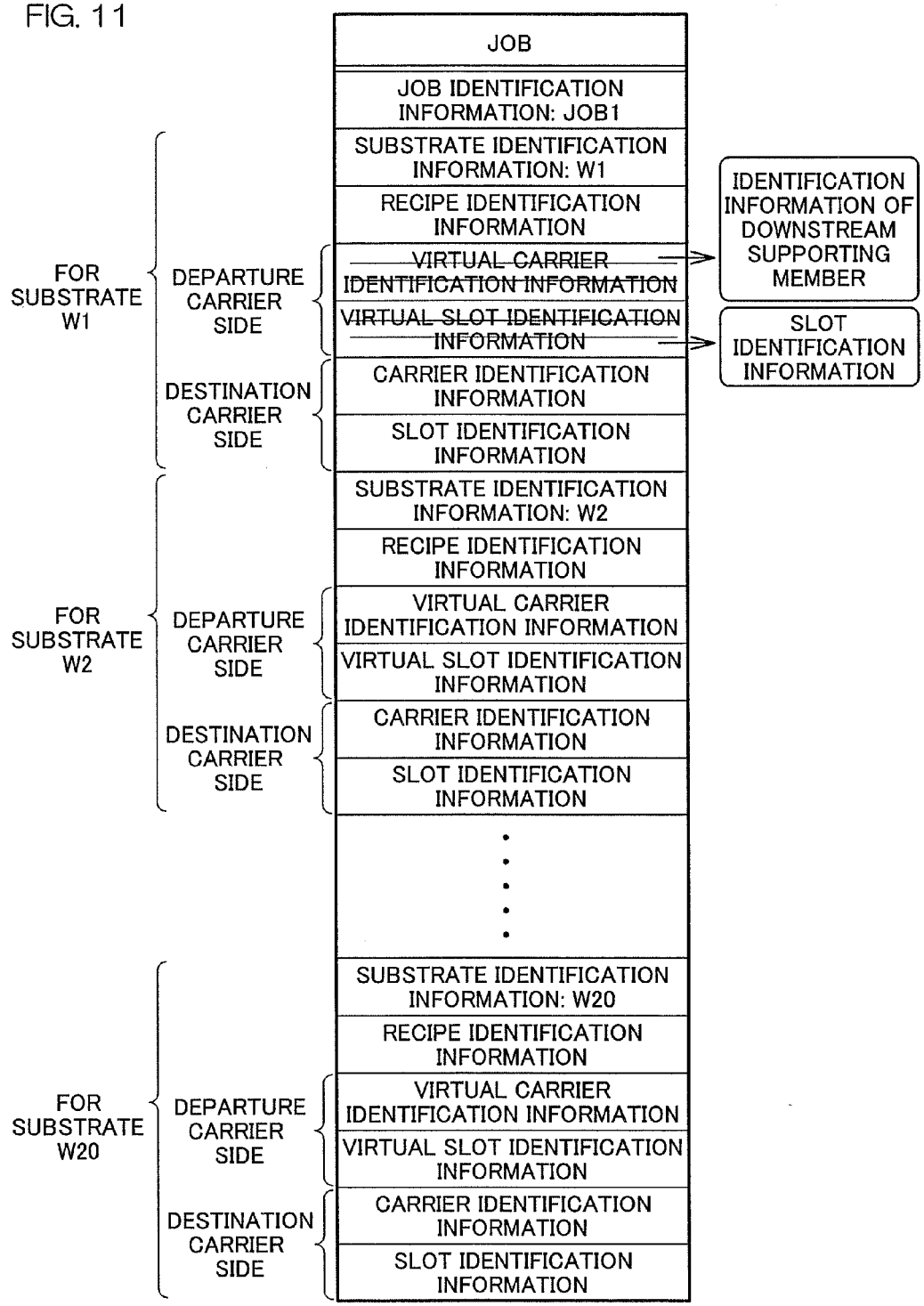
FIG. 11 is a diagram to describe a data structure of a job that has been changed.

When substrate arrival information is received by the host computer HC, the host computer HC transmits the substrate arrival information to the second control device 24 (step S18), and imparts the fact that a substrate W has reached a conveyable range to which the second indexer robot IR2 is capable of conveying a substrate W to the second control device 24. As described above, the substrate arrival information includes substrate identification information, identification information of the downstream supporting member 12, and slot identification information of a slot in which a substrate has been inserted. When substrate arrival information is received by the second control device 24, the second control device 24 changes a process job PJ of a substrate identified by the substrate identification information as shown in FIG. 11 (step S18-1). More specifically, virtual carrier identification information included in the PJ is changed to identification information of the downstream supporting member 12, and virtual slot identification information is changed to slot identification information of the downstream supporting member 12. Therefore, the virtual carrier creation command transmitted from the host computer HC to the second control device 24 is changed to convey the substrate W from the downstream supporting member 12 of the intermediate apparatus 3 that is an apparatus differing from the second substrate processing apparatus 4 to the second carrier C held by the second load port LP2.

In principle, in the same order as in a case in which a substrate W reaches the downstream supporting member 12, the second control device 24 takes out an unprocessed substrate W from the downstream supporting member 12 by means of the second indexer robot IR2 and convey and/or process the substrate W in the second substrate processing apparatus 4.

As described later, the second control device 24 conveys a substrate W, which has been conveyed to the intermediate apparatus 3, to the second processing module 23, and creates a schedule to convey the substrate W processed by the second processing module 23 to a carrier C held by the second load port LP2 for each substrate W. Thereafter, the second control device 24 allows the resource, such as the second indexer module 22 or the second processing module 23, provided in the second substrate processing apparatus 4 to execute the schedule (step S19). Therefore, the substrate W processed by the first substrate processing apparatus 2 is conveyed from the first substrate processing apparatus 2 to the second substrate processing apparatus 4 through the intermediate apparatus 3. In other words, the substrate W is not conveyed by the carrier transfer robot 5 in a state of being contained in the carrier C, but is conveyed from the first substrate processing apparatus 2 to the second substrate processing apparatus 4 by means of the first substrate processing apparatus 2, the second substrate processing apparatus 4, and the intermediate apparatus 3. Thereafter, the substrate W conveyed to the second substrate processing apparatus 4 is processed by the second substrate processing apparatus 4, and then is contained in the second carrier C held by the second load port LP2. Thereafter, the second carrier C in which the already-processed substrate W is contained is conveyed by the carrier transfer robot 5 to a substrate processing apparatus that performs subsequent steps (step S20).

Figure 6:
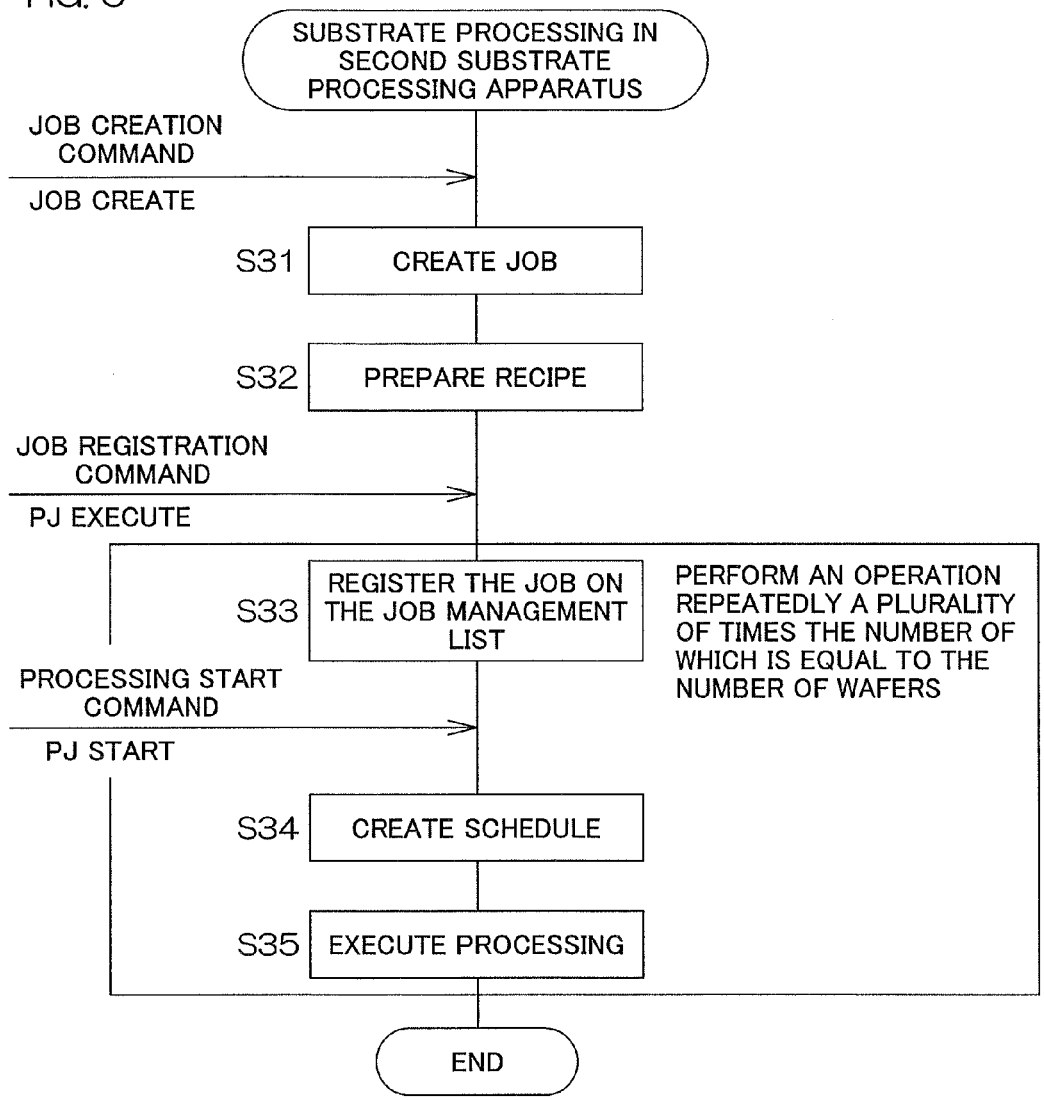
FIG. 6 is a flowchart showing a process from the creation of a job in the second substrate processing apparatus 4 until the substrate W has been processed by the second substrate processing apparatus 4.

FIG. 6 is a flowchart until a substrate W is processed by the second substrate processing apparatus 4 from the creation of a job in the second substrate processing apparatus 4.

As described above, the second substrate processing apparatus 4 is capable of dealing with not only a case (hereinafter, referred to as "one-by-one conveyance") in which unprocessed substrates W are conveyed from the intermediate apparatus 3 through the direct carry-in entrance 25a but also a case (hereinafter, referred to as "carrier conveyance") in which a carrier C2 that stores unprocessed substrates W is conveyed to the second load port LP2 by means of the carrier transfer robot 5. In the one-by-one conveyance, and, likewise, in the carrier conveyance, a job creation command is sent from the host computer HC to the second control device 24 when the position of the departure carrier and the position of the destination carrier are recognized by the second control device 24 (however, in the one-by-one conveyance, a virtual carrier VCR1 corresponding to a carrier C1 placed at the load port LP1 of the first substrate processing apparatus 2 is recognized as a departure carrier by means of the second control device 24). The second control device 24 receives the job creation command, and creates a job that includes attribute information of the departure carrier and attribute information of the destination carrier thereinside (step S31). The job created at this time is capable of having the same data structure both in the one-by-one conveyance and in the carrier conveyance (see FIG. 10). In other words, the second control device 24 is not required to change the data structure of a job in accordance with whether the departure carrier is an actual carrier or a virtual carrier.

Thereafter, the second control device 24 reads and prepares a recipe corresponding to recipe identification information specified by a job creation command from the auxiliary storage device 37 (step S32).

When a plurality of job registration commands (PJExecute) that correspond to a plurality of PJs, respectively, are transmitted from the host computer HC to the second control device 24, the second control device 24 registers the PJs specified by the job registration commands on the job management list 42 (step S33).

In the carrier conveyance, PJs with respect to all substrates W stored in a single carrier C placed at the second load port LP2 are created, and then are registered on the job management list.

On the other hand, in the one-by-one conveyance, whenever a substrate W reaches the downstream supporting member 12 and then substrate arrival information is sent from the host computer HC to the second control device 24 (S18), a job registration command of this substrate W is transmitted to the second control device 24 from the host computer HC, and a PJ of this substrate W is registered on the job management list 42.

However, even in the one-by-one conveyance, a PJ of this substrate W has already been created at the point of time (step S6) of a stage (step S10) prior to step S16 in which a substrate W reaches the downstream supporting member 12, and therefore the host computer HC is capable of transmitting a job registration command to the second control device 24 at an arbitrary timing subsequent to step S6.

When a plurality of processing start commands (PJStart) corresponding to a plurality of PJs are transmitted from any one of the intermediate apparatus 3, the second load port LP2, and the host computer HC to the second control device 24, the second control device 24 creates a schedule to convey and/or process substrates W by means of the second substrate processing apparatus 4 for each substrate W in accordance with the order registered on the job management list 42 (step S34). In the one-by-one conveyance, based on virtual positional information of a substrate W before this substrate W is carried into the second substrate processing apparatus 4, it is also possible to create a schedule to convey and/or process substrates W inside the second substrate processing apparatus 4.

Thereafter, the second control device 24 allows a resource provided in the second substrate processing apparatuses 4, such as the second indexer module 22 or the second processing module 23, to execute the schedule (step S35). The once created schedule can be appropriately changed. For example, it is possible to change the schedule so that, when a substrate W processed by the first substrate processing apparatus 2 is conveyed to the downstream supporting member 12 while the second substrate processing apparatus 4 is operating according to a schedule for unprocessed substrates W contained in a carrier C placed on the second load port LP2, the substrate W is processed in preference to an unprocessed substrate W taken out from the carrier C.

An example of first schedules for a substrate W contained in a carrier C on the second load port LP2 is a schedule to convey a substrate W contained in a carrier C held by the second load port LP2 to the second processing unit MPC through the relay unit 28 and to convey the substrate W processed by the second processing unit MPC to the carrier C held by the second load port LP2 through the relay unit 28. In other words, in this schedule, the substrate W is conveyed from a position in the second substrate processing apparatus 4 to a position in the second substrate processing apparatus 4 (i.e., a position that is the same as or is different from the initial position).

An example of second schedules (second schedules 1) for a substrate W transferred from the intermediate apparatus 3 to the second substrate processing apparatus 4 via the direct carry-in entrance 25*a* is a schedule to convey a substrate W held by the intermediate apparatus 3 to the second processing unit MPC through the relay unit 28 and to convey the substrate W processed by the second processing unit MPC to the carrier C held by the second load port LP2 through the relay unit 28. In other words, in this schedule, the substrate W is conveyed from a position in an apparatus (the intermediate apparatus 3) differing from the second substrate processing apparatus 4 to a position in the second substrate processing apparatus 4.

Another example (second schedule 2) of the second schedule is a schedule to allow the second indexer robot IR2 to convey a substrate W carried from the intermediate apparatus 3 into the second substrate processing apparatus 4 by means of the second indexer robot IR2 to the evacuation unit 29 and to allow the second indexer robot IR2 to convey a substrate W contained in the evacuation unit 29 from the evacuation unit 29 to a carrier C held by the second load port LP2 without processing the substrate W by means of the second processing unit MPC.

Still another example (second schedule 3) of the second schedule is a schedule to allow the second indexer robot IR2 to convey a substrate W carried into the second substrate processing apparatus 4 through the direct carry-in entrance 25*a* from the intermediate apparatus 3 to a carrier C held by the second load port LP2 while avoiding the temporarily-holding unit 27 (the relay unit 28 and the evacuation unit 29) and the second processing unit MPC. In other words, in this schedule, a substrate W is directly conveyed to the second load port LP2 from the intermediate apparatus 3 by means of the second indexer robot IR2 without being conveyed via the temporarily-holding unit 27 and the second center robot CR2.

The second control device 24 allows the resource of the second substrate processing apparatus 4 to execute the first schedule, thereby allowing the second substrate processing apparatus 4 to convey and/or process a substrate W contained in a carrier C placed on the second load port LP2 (hereinafter, referred to as a "first substrate W"). Likewise, the second control device 24 allows the resource of the second substrate processing apparatus 4 to execute the second schedule, thereby allowing the second substrate processing apparatus 4 to convey and/or process a substrate W carried from the intermediate apparatus 3 into the second substrate processing apparatus 4 through the direct carry-in entrance 25*a* (hereinafter, referred to as a "second substrate W").

If a processing start command of the second substrate W is given while executing the first schedule, the second control device 24 may temporarily stop or discontinue the execution of the first schedule and may execute the second schedule preferentially. For example, the second control device 24 may temporarily stop carrying out the first substrate W from the carrier C or carrying the first substrate W into the second processing unit MPC, and may allow the resource of the second substrate processing apparatus 4 to execute the second schedule while stopping the carrying operation. On the contrary, if a processing start command of the first substrate W is given while executing the second schedule, the second control device 24 may temporarily stop or discontinue the execution of the second schedule and may execute the first schedule preferentially.

As described above, in the present preferred embodiment, the second control device 24 creates a first virtual carrier corresponding to a carrier that does not exist in the second substrate processing apparatus 4, and hence stores positional information of a substrate W that has not yet been carried into the second substrate processing apparatus 4, i.e., stores positional information of a substrate W outside the second substrate processing apparatus 4. Thereafter, based on the pre-stored positional information, the second control device 24 creates a second schedule to convey a substrate W from the outside of the second substrate processing apparatus 4 to the second substrate processing apparatus 4 through the direct carry-in entrance 25*a* before the substrate W is carried into the second substrate processing apparatus 4 from the intermediate apparatus 3 through the direct carry-in entrance 25*a*. In this way, the second schedule that includes a conveying step of a substrate W outside the second substrate processing apparatus 4 is created, and therefore the substrate W is smoothly conveyed from the outside of the second substrate processing apparatus 4 to the inside of the second substrate processing apparatus 4. As a result, time loss caused until a substrate W carried into the first substrate processing apparatus 2 is conveyed into the second substrate processing apparatus 4 through the intermediate apparatus 3 is reduced. This makes it possible to shorten a conveyance period of time of a substrate W from the first substrate processing apparatus 2 to the second substrate processing apparatus 4.

Additionally, in the present preferred embodiment, the quality of a substrate W processed by the first substrate processing apparatus 2 is inspected before this substrate W is carried into the second substrate processing apparatus 4. The second control device 24 creates a second schedule not only so that the second transfer unit conveys a substrate W between the outside of the second substrate processing apparatus 4 and the inside of the second substrate processing apparatus 4 through the direct carry-in entrance 25*a* but also so that the second processing unit MPC processes a substrate W under a substrate processing condition according to an inspection result. Therefore, it is possible for the second processing unit MPC to perform a processing operation according to the quality of the substrate W, and hence is possible to raise the quality of the substrate W.

Additionally, in the present preferred embodiment, the first inspection unit 9 is provided in the first substrate processing apparatus 2, and the quality of a substrate W processed by the first substrate processing apparatus 2 is inspected by the first substrate processing apparatus 2. If the first inspection unit 9 is provided in an apparatus other than the first substrate processing apparatus 2 and the intermediate apparatus 3, i.e., if the first inspection unit 9 is provided outside the conveying path of a substrate W, the substrate W is required to be conveyed to the outside of the first substrate processing apparatus 2 and of the intermediate apparatus 3, and therefore an extra conveying time for it is generated. Therefore, it is possible to shorten the conveying time of a substrate W from the first substrate processing apparatus 2 to the second substrate processing apparatus 4 by providing the first inspection unit 9 in the first substrate processing apparatus 2.

Additionally, in the present preferred embodiment, the plurality of second load ports LP2 that hold the plurality of carriers C, respectively, are provided in the second substrate processing apparatus 4. The second control device 24 creates the first schedule so that a substrate W contained in the carrier C is conveyed from the second load port LP2 to the second processing unit MPC and so that the substrate W processed by the second processing unit MPC is conveyed from the second processing unit MPC to the second load port LP2. In this way, it is possible for the second substrate processing apparatus 4 to accept a substrate W not only from the direct carry-in entrance 25a but also from the second load port LP2, and therefore it is possible to raise the operating efficiency of the second substrate processing apparatus 4.

Additionally, in the present preferred embodiment, the execution of one of the first schedule and the second schedule is temporarily stopped or is discontinued, i.e., the execution of a non-priority schedule that differs from a priority schedule to take precedence is temporarily stopped or is discontinued. The remaining one of the first schedule and the second schedule is executed, i.e., a priority schedule is executed by the second substrate processing apparatus 4. Therefore, it is possible to make the start of processing of a substrate W corresponding to the priority schedule earlier. Therefore, with respect to a substrate W corresponding to a priority schedule, it is possible to shorten a period of time from the end of substrate processing in a preceding apparatus (the first substrate processing apparatus 2) to the start of substrate processing in a subsequent apparatus (the second substrate processing apparatus 4).

Additionally, in the present preferred embodiment, the second control device 24 creates the second schedule so that the second transfer unit conveys a substrate W from the intermediate apparatus 3 to the second load port LP2 through the direct carry-in entrance 25a. Therefore, the substrate W carried into the second substrate processing apparatus 4 through the direct carry-in entrance 25a is conveyed to the second load port LP2 without being processed by the plurality of second processing units MPC. For example, if a substrate W processed by the first substrate processing apparatus 2 is defective, substrate processing in the second substrate processing apparatus 4 will become useless. Therefore, in such a case, it is possible to raise the operating efficiency of the second substrate processing apparatus 4 by avoiding the processing of the substrate W in the second substrate processing apparatus 4. Additionally, the conveying path becomes shorter than when a substrate W is conveyed via the second processing unit MPC, and therefore the stay time of the substrate W in the second substrate processing apparatus 4 is shortened. Therefore, for example, if a substrate W carried from the intermediate apparatus 3 into the second substrate processing apparatus 4 is contaminated, it is possible to restrain or prevent the inside of the second substrate processing apparatus 4 from being contaminated by foreign substances that adhere to the substrate W. This makes it possible to raise the quality of other substrates W.

Additionally, in the present preferred embodiment, the second control device 24 creates the second schedule so that the second transfer unit conveys a substrate W from the intermediate apparatus 3 to the evacuation unit 29 through the direct carry-in entrance 25a and then conveys this substrate W from the evacuation unit 29 to the plurality of load ports. In other words, a substrate W carried into the second substrate processing apparatus 4 through the direct carry-in entrance 25a is conveyed from the intermediate apparatus 3 to the plurality of second load ports LP2 via the evacuation unit 29 that evacuates a substrate W, instead of the plurality of second Processing units MPC. As described above, if a substrate W processed by the first substrate processing apparatus 2 is defective, substrate processing in the second substrate processing apparatus 4 will become useless. Therefore, in such a case, it is possible to raise the operating efficiency of the second substrate processing apparatus 4 by avoiding the processing of the substrate W in the second substrate processing apparatus 4. Additionally, a substrate W is conveyed via the evacuation unit 29 instead of the second processing unit MPC, and therefore it is possible for the second control device 24 to create the schedule of a to-be-evacuated substrate W in the same way as a substrate W processed by the second processing unit MPC.

Although the embodiment of the present invention has been described above, the present invention is not restricted to the contents of the above-described embodiment and various modifications are possible within the scope of the present invention.

For example, as described in the above preferred embodiment, a recipe initially specified by a PJ is replaced with a recipe that reflects an inspection result of the first inspection unit 9, and substrate processing conditions in the second processing unit MPC are changed. In other words, as described above, a substrate W is processed by the second processing unit MPC whatever the inspection result is. However, a substrate W may be processed by a recipe initially specified without being replaced with another recipe. Additionally, the second control device 24 may create a second schedule so that a substrate W may avoid the second processing unit MPC and may be conveyed from the intermediate apparatus 3 to the second load port LP2 based on an inspection result of the first inspection unit 9 (inspection information sent from the host computer HC).

Additionally, as described in the above preferred embodiment, the first inspection unit 9 measures the line width of a pattern formed on the front surface of a substrate W that has been processed (a substrate W that has undergone dry etching), and yet an inspection other than the line width measurement may be performed by the first inspection unit 9. For example, if the first substrate processing apparatus 2 is a film formation apparatus, the thickness of a thin film formed by the first substrate processing apparatus 2 may be measured by the first inspection unit 9.

Additionally, as described in the above preferred embodiment, an inspection unit (first inspection unit 9) that inspects the quality of a substrate W is provided in the first substrate processing apparatus 2, and yet the inspection unit may be provided in the intermediate apparatus 3. Additionally, the first inspection unit 9 maybe excluded from the substrate processing system 1.

Additionally, as described in the above preferred embodiment, the first inspection unit 9 inspects all substrates W that have been processed by the first substrate processing apparatus 2, and yet only some substrates W that have been processed by the first substrate processing apparatus 2 may be inspected by the first inspection unit 9.

Additionally, as described in the above preferred embodiment, the first substrate processing apparatus 2, the intermediate apparatus 3, and the second substrate processing apparatus 4 are arranged in this order in the horizontal arrangement direction D1 of carriers C, and yet the first substrate processing apparatus 2, the intermediate apparatus 3, and the second substrate processing apparatus 4 may be arranged in this order in a horizontal orthogonal direction D2 perpendicular to the arrangement direction D1 of carriers C.

Additionally, as described in the above preferred embodiment, the evacuation box 32 of the evacuation unit 29 includes an opening that is open toward the second indexer robot IR2 and an opening that is open toward the second center robot CR2, and yet one of the two openings may be excluded so that only one of the second indexer robot IR2 and the second center robot CR2 is accessible to the inside of the evacuation unit 29. In other words, it is only necessary to arrange the evacuation box 32 so that the hands H of at least one of the second indexer robot IR2 and the second center robot CR2 are enterable into the evacuation box 32.

Additionally, as described in the above preferred embodiment, the second processing module 23 includes the temporarily-holding unit 27, and a second transfer unit includes the second indexer robot IR2, the second center robot CR2, and the temporarily-holding unit 27, and yet the temporarily-holding unit 27 may be excluded, and the second indexer robot IR2 and the second center robot CR2 may directly deliver a substrate W.

Additionally, as described in the above preferred embodiment, the second opening-closing device that opens and closes the downstream shutter 19 by which the direct carry-in entrance 25a is opened and closed is controlled by the intermediate control device 13, and yet the second opening-closing device may be controlled by the second control device 24.

Additionally, two or more among all aforementioned preferred embodiments may be combined together.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2013-156946 filed in the Japan Patent Office on Jul. 29, 2013, the disclosure of which is incorporated herein by reference by its entirety.

DESCRIPTION OF THE SYMBOLS

1: Substrate processing system
2: First substrate processing apparatus
3: Intermediate apparatus
4: Second substrate processing apparatus
9: First inspection unit
11: Upstream supporting member
12: Downstream supporting member
13: Intermediate control device
14: Intermediate box
15: Upstream box
16: Box body
17: Downstream box
18: Upstream shutter
19: Downstream shutter
20: Exhaust duct
22: Second indexer module
23: Second processing module
24: Second control device
25: Second indexer box
25a: Direct carry-in entrance
27: Temporarily-holding unit
28: Relay unit
29: Evacuation unit
41: Scheduling portion
42: Job management list
43: Job management portion
44: Scheduling engine
45: Processing execution command portion
C: Carrier
CR2: Second center robot
HC: Host computer
IR1: First indexer robot
IR2: Second indexer robot
LP1: First load port
LP2: Second load port
MPC: Second processing unit
R3: Intermediate transfer robot
W: Substrate

What is claimed is:

1. A substrate processing apparatus having a control device that creates a job in accordance with a job creation command sent from a host computer and that controls the substrate processing apparatus to convey and/or process a substrate in a predetermined management area in the substrate processing apparatus based on the job;

the substrate processing apparatus receiving a substrate from an intermediate apparatus that conveys a substrate that has been processed by a first substrate processing apparatus while directly supporting the substrate outside the first substrate processing apparatus, the first substrate processing apparatus being another substrate processing apparatus that processes a substrate at an earlier stage than said substrate processing apparatus, the substrate processing apparatus comprising:

a direct carry-in entrance that accepts a substrate carried in from the intermediate apparatus;

a transfer unit that conveys the substrate carried into the substrate processing apparatus through the direct carry-in entrance and that conveys the substrate inside the management area;

a plurality of processing units in the management area that process the substrate carried in by means of the transfer unit; and said control device;

wherein the control device executes:

a first step of, when the fact that a substrate scheduled to be processed by the substrate processing apparatus has been placed at the first substrate processing apparatus is reported from the host computer, storing positional information of the substrate in the first substrate processing apparatus and correlating the positional information of the substrate in the first substrate processing apparatus with virtual substrate positional information capable of being recognized by the control device;

a second step of, when a job creation command for the substrate is given from the host computer, creating a job to convey and/or process the substrate by means of the substrate processing apparatus while using the virtual substrate positional information; and a third step of, before the substrate is carried into the substrate processing apparatus, creating a second schedule including a carrying-in step of allowing the transfer unit to convey a substrate carried into the substrate processing apparatus through the direct carry-in entrance from an outside of the substrate processing apparatus to an inside of the substrate processing apparatus by use of the virtual substrate positional information stored in the first step.

2. The substrate processing apparatus according to claim 1, wherein the control device further executes a fourth step of setting a substrate processing condition according to an inspection result of an inspection unit that inspects a substrate processed by the first substrate processing apparatus before the substrate is carried into the substrate processing apparatus, and wherein the third step includes a step, before the substrate is carried into the substrate processing apparatus, of creating the second schedule including the carrying-in step and a processing step of allowing the plurality of processing units to process a substrate conveyed to the plurality of processing units in the carrying-in step under the substrate processing condition by use of the virtual substrate positional information stored in the first step.

3. The substrate processing apparatus according to claim 2, wherein the fourth step includes a step of setting the substrate processing condition in accordance with an inspection result of the inspection unit provided in one of the first substrate processing apparatus and the intermediate apparatus.

4. The substrate processing apparatus according to claim 1, further comprising a plurality of load ports that hold a plurality of carriers, respectively, the carriers being capable of containing a plurality of substrates, wherein the third step includes a step of creating the second schedule so that a substrate carried into the substrate processing apparatus through the direct carry-in entrance is conveyed by the transfer unit from the outside of the substrate processing apparatus to the load port without conveying the substrate to the plurality of processing units.

5. The substrate processing apparatus according to claim 1, further comprising:

a plurality of load ports that hold a plurality of carriers, respectively, the carriers being capable of containing a plurality of substrates; and an evacuation unit that evacuates a substrate;

wherein the third step includes a step of creating the second schedule so that a substrate carried into the substrate processing apparatus through the direct carry-in entrance is conveyed by the transfer unit from the outside of the substrate processing apparatus to the evacuation unit and is conveyed from the evacuation unit to the plurality of load ports.

6. The substrate processing apparatus according to claim 1, further comprising a plurality of load ports that hold a plurality of carriers, respectively, the carriers being capable of containing a plurality of substrates, wherein the control device further executes a fifth step of creating a first schedule including:

a carrying-in step of allowing the transfer unit to convey a substrate from the plurality of load ports to the plurality of processing units;

a processing step of allowing the plurality of processing units to process the substrate conveyed to the plurality of processing units; and a carrying-out step of allowing the transfer unit to convey the substrate processed by the plurality of processing units from the plurality of processing units to the plurality of load ports.

7. The substrate processing apparatus according to claim 6, wherein the control device further executes a sixth step of stopping execution of one of the first schedule and the second schedule and allowing the substrate processing apparatus to execute a remaining one of the first schedule and the second schedule.

8. The substrate processing apparatus according to claim 1, further comprising a downstream shutter controlled by said control device, wherein the direct carry-in entrance is opened and closed by the downstream shutter in accordance with said job.

9. A substrate processing system comprising:

a first substrate processing apparatus that processes a substrate;

the substrate processing apparatus according to claim 1;

an intermediate apparatus that conveys a substrate processed by the first substrate processing apparatus between the first substrate processing apparatus and the substrate processing apparatus in a state of directly supporting the substrate outside the first substrate processing apparatus; and a host computer that controls the first processing apparatus, the intermediate apparatus and the substrate processing apparatus.

10. The substrate processing system according to claim 9, further comprising a downstream shutter controlled by said control device, wherein the direct carry-in entrance is opened and closed by the downstream shutter in accordance with said job.

11. A substrate processing method executed by a substrate processing apparatus, the substrate processing apparatus having a control device that creates a job in accordance with a job creation command sent from a host computer and controls the substrate processing apparatus to execute conveyance and/or processing of a substrate in a predetermined management area in the substrate processing apparatus based on the job, the substrate processing apparatus receiving a substrate from an intermediate apparatus that conveys a substrate that has been processed by a first substrate processing apparatus while directly supporting the substrate outside the first substrate processing apparatus, the first substrate processing apparatus being another substrate processing apparatus that processes a substrate at an earlier stage than said substrate processing apparatus, the substrate processing apparatus including a direct carry-in entrance that accepts a substrate carried in from the intermediate apparatus, a transfer unit that conveys the substrate carried into the substrate processing apparatus through the direct carry-in entrance and that conveys the substrate inside the management area, a plurality of processing units in the management area that process the substrate carried in by means of the transfer unit, and said control device, the substrate processing method being carried out by the control device and comprising:

a first step of, when the fact that a substrate scheduled to be processed by the substrate processing apparatus has been placed at the first substrate processing apparatus is reported from the host computer, storing positional information of the substrate in the first substrate processing apparatus and correlating the positional information of the substrate in the first substrate processing apparatus with virtual substrate positional information capable of being recognized by the control device;

a second step of, when a job creation command for the substrate is given from the host computer, creating a job to convey and/or process the substrate by means of the substrate processing apparatus while using the virtual substrate positional information; and a third step of, before the substrate is carried into the substrate processing apparatus, creating a second schedule including a carrying-in step of allowing the transfer unit to convey a substrate carried into the substrate processing apparatus through the direct carry-in entrance from an outside of the substrate processing apparatus to an inside of the substrate processing apparatus by use of the virtual substrate positional information stored in the first step.

12. The substrate processing method according to claim 11, further comprising a fourth step of setting a substrate processing condition according to an inspection result of an inspection unit that inspects a substrate processed by the first substrate processing apparatus before the substrate is carried into the substrate processing apparatus, wherein the third step includes a step, before the substrate is carried into the substrate processing apparatus, of creating the second schedule including the carrying-in step and a processing step of allowing the plurality of processing units to process a substrate conveyed to the plurality of processing units in the carrying-in step under the substrate processing condition by use of the virtual substrate positional information stored in the first step.

13. The substrate processing method according to claim 12, wherein the fourth step includes a step of setting the substrate processing condition in accordance with an inspection result of the inspection unit provided in one of the first substrate processing apparatus and the intermediate apparatus.

14. The substrate processing method according to claim 11, wherein the substrate processing apparatus further includes a plurality of load ports that hold a plurality of carriers, respectively, the carriers being capable of containing a plurality of substrates, and wherein the third step includes a step of creating the second schedule so that a substrate carried into the substrate processing apparatus through the direct carry-in entrance is conveyed by the transfer unit from the outside of the substrate processing apparatus to the load port without conveying the substrate to the plurality of processing units.

15. The substrate processing method according to claim 11, wherein the substrate processing apparatus further includes a plurality of load ports that hold a plurality of carriers, respectively, the carriers being capable of containing a plurality of substrates, and an evacuation unit that evacuates a substrate, and wherein the third step includes a step of creating the second schedule so that a substrate carried into the substrate processing apparatus through the direct carry-in entrance is conveyed by the transfer unit from the outside of the substrate processing apparatus to the evacuation unit and is conveyed from the evacuation unit to the plurality of load ports.

16. The substrate processing method according to claim 11, wherein the substrate processing apparatus further includes a plurality of load ports that hold a plurality of carriers, respectively, the carriers being capable of containing a plurality of substrates, the substrate processing method further comprising a fifth step of creating a first schedule including:

a carrying-in step of allowing the transfer unit to convey a substrate from the plurality of load ports to the plurality of processing units;

a processing step of allowing the plurality of processing units to process the substrate conveyed to the plurality of processing units; and a carrying-out step of allowing the transfer unit to convey the substrate processed by the plurality of processing units from the plurality of processing units to the plurality of load ports.

17. The substrate processing method according to claim 16, further comprising a sixth step of stopping execution of one of the first schedule and the second schedule and allowing the substrate processing apparatus to execute a remaining one of the first schedule and the second schedule.

18. The substrate processing method according to claim 11, further comprising a downstream shutter controlled by said control device, wherein the direct carry-in entrance is opened and closed by the downstream shutter in accordance with said job.

* * * * *